(12) United States Patent
Dorobantu et al.

(10) Patent No.: US 11,988,966 B2
(45) Date of Patent: May 21, 2024

(54) GAS MONITORING SYSTEM

(71) Applicant: Cymer, LLC, San Diego, CA (US)

(72) Inventors: Andrei Dorobantu, San Diego, CA (US); Shreyas Bhaban, Minneapolis, MN (US)

(73) Assignee: Cymer, LLC, San Diego, CA (US)

( * ) Notice: Subject to any disclaimer, the term of this patent is extended or adjusted under 35 U.S.C. 154(b) by 703 days.

(21) Appl. No.: 15/734,359

(22) PCT Filed: May 16, 2019

(86) PCT No.: PCT/US2019/032615
§ 371 (c)(1),
(2) Date: Dec. 2, 2020

(87) PCT Pub. No.: WO2019/240906
PCT Pub. Date: Dec. 19, 2019

(65) Prior Publication Data
US 2021/0226407 A1    Jul. 22, 2021

Related U.S. Application Data

(60) Provisional application No. 62/684,352, filed on Jun. 13, 2018.

(51) Int. Cl.
*G03F 7/20* (2006.01)
*G03F 7/00* (2006.01)
(Continued)

(52) U.S. Cl.
CPC ...... *G03F 7/70025* (2013.01); *G03F 7/70483* (2013.01); *H01S 3/036* (2013.01);
(Continued)

(58) Field of Classification Search
CPC .. G03F 7/70025; G03F 7/70483; H01S 3/036; H01S 3/097; H01S 3/10069;
(Continued)

(56) References Cited

U.S. PATENT DOCUMENTS

| 5,440,578 A | 8/1995 | Sandstrom |
| 5,642,374 A | 6/1997 | Wakabayashi et al. |

(Continued)

FOREIGN PATENT DOCUMENTS

| CN | 101059420 A | 10/2007 |
| CN | 101179008 A | 5/2008 |

(Continued)

OTHER PUBLICATIONS

Office Action, counterpart Chinese Patent Application No. 201980039572.1, dated Feb. 28, 2022, 10 pages total (including English translation of 5 pages).

(Continued)

*Primary Examiner* — Mesfin T Asfaw
(74) *Attorney, Agent, or Firm* — DiBerardino McGovern IP Group LLC

(57) ABSTRACT

A system includes an optical source configured to emit a pulsed light beam, the optical source comprising one or more chambers, each of the one or more chambers configured to hold a gaseous gain medium, the gaseous gain medium being associated with an assumed gas life; at least one detection module configured to: receive and analyze data related to the pulsed light beam, and produce a beam quality metric based on the data related to the pulsed light beam; and a monitoring module configured to: analyze the beam quality metric, determine a health status of the gaseous gain medium based on the analysis of the beam quality metric, and produce a status signal based on the determined health status, the status signal indicating whether to extend use of the gaseous gain medium beyond the assumed gas life or to end use of the gaseous gain medium.

24 Claims, 6 Drawing Sheets

(51) Int. Cl.
  *H01S 3/036* (2006.01)
  *H01S 3/097* (2006.01)
  *H01S 3/10* (2006.01)
  *H01S 3/134* (2006.01)
  *H01S 3/225* (2006.01)
  *H01S 3/23* (2006.01)

(52) U.S. Cl.
  CPC .......... *H01S 3/097* (2013.01); *H01S 3/10069* (2013.01); *H01S 3/134* (2013.01); *H01S 3/225* (2013.01); *H01S 3/2308* (2013.01)

(58) Field of Classification Search
  CPC ........ H01S 3/134; H01S 3/225; H01S 3/2308; H01S 3/0971; H01S 3/104; H01S 3/2333; B01D 53/30
  See application file for complete search history.

(56) References Cited

U.S. PATENT DOCUMENTS

| | | |
|---|---|---|
| 6,188,710 B1 | 2/2001 | Besaucele et al. |
| 6,212,214 B1 | 4/2001 | Vogler et al. |
| 6,243,405 B1 | 6/2001 | Borneis et al. |
| 6,721,345 B2 | 4/2004 | Bragin et al. |
| 2002/0021731 A1 | 2/2002 | Bragin et al. |
| 2003/0138019 A1 | 7/2003 | Rylov et al. |
| 2004/0252740 A1 | 12/2004 | Albrecht et al. |
| 2005/0046856 A1 | 3/2005 | Rao et al. |
| 2008/0205472 A1 | 8/2008 | Dunstan et al. |
| 2011/0235663 A1 | 9/2011 | Akins et al. |
| 2012/0002687 A1 | 1/2012 | Ershov et al. |
| 2013/0170516 A1 | 7/2013 | Riggs |
| 2015/0003485 A1* | 1/2015 | Abe .................. H01S 3/09702 372/57 |
| 2015/0188274 A1* | 7/2015 | Wakabayashi ........ H01S 3/2256 372/25 |
| 2017/0201057 A1 | 7/2017 | Ahlawat et al. |
| 2018/0261973 A1 | 9/2018 | Fujimaki et al. |

FOREIGN PATENT DOCUMENTS

| | | |
|---|---|---|
| CN | 101482501 A | 7/2009 |
| JP | H02278887 A | 11/1990 |
| JP | H07335961 A | 12/1995 |
| JP | H11243242 A | 9/1999 |
| JP | 2000151002 A | 5/2000 |
| JP | 2007149915 A | 6/2007 |
| KR | 20110091788 A | 8/2011 |

OTHER PUBLICATIONS

Office Action, counterpart Japanese Patent Application No. 2020-563605, dated Feb. 1, 2022, 8 pages total (including English translation of 4 pages).

Office Action in counterpart Chinese Patent Application No. 201980039572.1, dated Jul. 20, 2022, 4 pages total (including partial English translation of 1 page).

Examination Bureau of the Korean Intellectual Property Office, Office Action in counterpart Korean Patent Application No. 10-2020-7035794, dated Aug. 22, 2022, 13 pages total (including partial English translation of 7 pages).

Lee W. Young, U.S. International Searching Authority, International Search Report and Written Opinion, counterpart PCT Application No. PCT/US2019/032615, dated Jul. 24, 2019, 12 pages total.

Wayne J. Dunstan et al., "Increased Availability of Lithography Light Sources using Advanced Gas Management," Optical Microlithography XX, Proc. of SPIE, vol. 6520, 652032, 8 pages, doi: 10.1117/12.712681 (2007).

Kevin O'Brien et al., "Performance Demonstration of Significant Availability Improvement in Lithography Light Sources using GLX™ Control System," Optical Microlithography XXI, Proc. of SPIE, vol. 6924, 69242Q, 9 pages, doi: 10.1117/12.777209 (2008).

* cited by examiner

GAS MONITORING SYSTEM

CROSS REFERENCE TO RELATED APPLICATIONS

This application claims priority to U.S. application Ser. No. 62/684,352, filed Jun. 13, 2018 and titled Gas Monitoring System, which is incorporated herein in its entirety by reference.

TECHNICAL FIELD

This disclosure relates to a gas monitoring system for an optical lithography system.

BACKGROUND

Photolithography is the process by which semiconductor circuitry is patterned on a substrate such as a silicon wafer. An optical source generates deep ultraviolet (DUV) light used to expose a photoresist on the wafer. DUV light may include wavelengths from, for example, about 100 nanometers (nm) to about 400 nm. Often, the optical source is a laser source (for example, an excimer laser) and the DUV light is a pulsed laser beam. The DUV light from the optical source interacts with a projection optical system, which projects the beam through a mask onto the photoresist on the silicon wafer. In this way, a layer of chip design is patterned onto the photoresist. The photoresist and wafer are subsequently etched and cleaned, and then the photolithography process repeats.

SUMMARY

In one aspect, a system includes an optical source configured to emit a pulsed light beam, the optical source including one or more chambers, each of the one or more chambers configured to hold a gaseous gain medium, the gaseous gain medium being associated with an assumed gas life; at least one detection module configured to: receive and analyze data related to the pulsed light beam, and produce a beam quality metric based on the data related to the pulsed light beam; and a monitoring module configured to: analyze the beam quality metric, determine a health status of the gaseous gain medium based on the analysis of the beam quality metric, and
produce a status signal based on the determined health status, the status signal indicating whether to extend use of the gaseous gain medium beyond the assumed gas life or to end use of the gaseous gain medium.

Implementations may include one or more of the following features. Analyzing the beam quality metric may include determining whether the pulsed light beam meets a pre-determined specification, and the beam quality metric may include an optical energy of the pulsed light beam, a spectral bandwidth of the pulsed light beam, and/or a wavelength of the pulsed light beam. The at least one detection module may include a plurality of detection modules, the plurality of detection modules including: a discharge count detection module configured to detect an occurrence of a discharge event in any of the one or more chambers and to produce a signal that indicates a count of discharge events over a period of time; a bandwidth detection module configured to detect a spectral bandwidth of the pulsed light beam and to produce a signal that indicates a spectral bandwidth of the pulsed light beam; an energy detection module configured to detect an energy of the pulsed light beam and to produce a signal that indicates an energy of the pulsed light beam; a wavelength detection module configured to detect a wavelength of the pulsed light beam and to produce a signal that indicates the wavelength of the pulsed light beam; and a gas detection module configured to detect an amount of a gas mixture injected into the one or more chambers and the produce a signal that indicates the amount of the gas mixture injected. Each of the bandwidth detection module, the energy detection module, and the wavelength detection module produce a beam quality metric based on, respectively, the signal produced by the bandwidth detection module, the signal produced by the energy detection module, and the signal produced by the wavelength detection module, The monitoring module analyzes the beam quality metric by analyzing the beam quality metric from the bandwidth detection module, the energy detection module, and the wavelength detection module, and the monitoring module is configured to determine the health status based on the analyzed beam quality metric, the signal produced by the gas detection module, and the signal produced by the discharge detection module. In some implementations, the plurality of detection modules further includes a sensor configured to detect fluorine and to produce a signal that indicates a concentration of fluorine in the gaseous gain medium, and, in these implementations, the monitoring module may be configured to determine the health status based on the signal produced by the sensor.

Moreover, in some implementations, the optical source includes two chambers, one of two chambers being a master oscillator and the other of the two chambers being a power amplifier, and the system further includes a timing controller configured to control discharge events in the master oscillator and the power amplifier. In these implementations, the plurality of detection modules further includes a timing detection module configured to monitor a difference in time between a discharge event in the master oscillator and a discharge event in the power amplifier.

The optical source may be associated with a plurality of parameters, each of the parameters having an acceptable range of values, and to analyze the produced signals from the plurality of detection modules, the monitoring module may be configured to determine whether the beam quality metric in each signal is within the acceptable range of values associated with that parameter.

In some implementations, the system further includes an optical lithography system configured to receive the pulsed light beam from the optical source. In these implementations, at least some of the detection modules are configured to receive data related to the pulsed light beam from the optical lithography system.

In some implementations, the beam quality metric has only two possible values.

In some implementations, the beam quality metric has a plurality of possible values, the plurality of possible values including a first value that indicates that the pulsed light beam does not meet the pre-defined specification, and the monitoring module being configured to analyze the beam quality metric includes the monitoring module being configured to count occurrences of the first value over a period of time or for a finite number of pulses. In these implementations, the monitoring module being configured to determine the health status of the gaseous gain medium may include the monitoring module being configured to compare the count of occurrences to a threshold, and the produced status signal may indicate to end use of the gaseous gain medium if the count of occurrences exceeds the threshold.

In another aspect, a system includes: a lithography system, the lithography system including an optical source, the optical source including at least one chamber configured to hold a gaseous gain medium, the gaseous gain medium being associated with an assumed gas life; and a monitoring system including: a monitoring data interface configured to receive information from the lithography system; and an electronic storage configured to store one or more rules and a library of modules, where each of the one or more rules associates an aspect of the gaseous gain medium with at least one module in the library of modules, and the monitoring system is configured to: access at least one rule, identify a module from a library of modules based on the accessed rule, and determine a health status for the gaseous gain medium in the optical source using the identified module and information from the lithography system.

Implementations may include one or more of the following features. The monitoring system may be further configured to produce a status signal based on the determined health status, the status signal indicating whether to extend use of the gaseous gain medium beyond the assumed gas life or to end use of the gaseous gain medium. In some implementations, the system also include a gas refill system fluidly coupled to at least one chamber, and, in these implementations, when the status signal indicates to end use of the gaseous gain medium, the monitoring system may be further configured to provide a command signal to the gas refill system, the command signal being sufficient to cause the gas refill system to remove the gaseous gain medium from the chamber and add a new gas mixture into the chamber. The assumed gas life for the gaseous gain medium may be a maximum number of occurrences of a discharge event in the chamber that holds the gaseous gain medium, and the system may further include a discharge count detection module configured to detect an occurrence of a discharge event in the chamber that holds the gaseous gain medium and to produce a discharge event count signal, the discharge event count signal indicating a count of discharge events over a period of time. In these implementations, when the status signal indicates to end use of the gaseous gain medium, the monitoring system may be further configured to provide a command signal to a gas refill system, the command signal being sufficient to cause the gas refill system to remove the gaseous gain medium from the chamber and to add a new gas into the chamber. The monitoring system may be further configured to compare the count of discharge events over the period of time to an initial analysis threshold, the initial analysis threshold being less than the assumed gas life, and the monitoring system may be configured to determine the health status for the gaseous gain medium and produce the status signal only if the count of discharge events over the period of time is greater than the initial analysis threshold.

The identified module may be configured to compare the information from the optical system to a data threshold to determine a health status of the gaseous gain medium, and the data threshold is configured to adapt during operation of the lithography system.

In some implementations, the lithography system further includes a lithography tool, and the monitoring system being configured to receive information from the lithography system includes the monitoring system being configured to receive information from the lithography tool and/or the optical source.

The information from the lithography system may include data from a plurality of detectors, each detector configured to monitor a particular aspect of a light beam produced by the optical source and to produce a signal including data related to the aspect of the light beam, the electronic storage may store a plurality of rules, the rules including at least one rule associated with each of the plurality of detectors, the library of modules may include a plurality of decision modules, each decision module being configured to: analyze the data related to a particular aspect of the light beam from one of the plurality of detectors by comparing the data to a respective criterion, determine whether the particular aspect the light beam is in or out of specification, and output a status indicator for the particular aspect, and the monitoring system is configured to determine the health status of the gaseous gain medium by analyzing all of the status indicators output by the decision module.

The assumed gas life for the gaseous gain medium may be a maximum number of occurrences of a discharge event in the chamber that holds the gaseous gain medium, and the system also may include a discharge count detection module configured to detect an occurrence of a discharge event in the chamber that holds the gaseous gain medium and to produce a discharge event count signal, the discharge event count signal indicating a count of discharge events over a period of time, the at least one rule may include at least a gas baseline rule that associates the count of discharge events with at least a first module and a second module in the library of modules, the first module may be configured to: measure and store a parameter related to operation of the optical source as a baseline measurement, and to determine the health status as a baseline status, the second module may be configured to: compare a measured parameter to the stored baseline measurement, and to determine the health status based at least on the measured parameter, and the gas baseline rule may compare the count of discharge events to a threshold and identifies: the first module if the count is less than the threshold, or the second module if the metric is greater than or equal to the threshold.

In another aspect, a monitoring system includes: a monitoring data interface configured to communicate with a plurality of lithography systems, each of the plurality of lithography systems including an optical sources configured to hold a gaseous gain medium associated with an assumed gas life; and an electronic storage configured to store one or more rules and a library of modules, where each of the one or more rules associates an aspect of the gaseous gain medium with at least one module in the library of modules, and the monitoring system is configured to: access at least one rule, identify a module from a library of modules based on the accessed rule.

determine a health status for the gaseous gain medium in a first group of lithography systems using the identified module and information from the first group of lithography systems, wherein the first group of lithography systems includes at least one of the plurality of lithography systems, and determine whether to extend the use of the gaseous gain medium in a second group of lithography systems beyond the assumed gas life based on the determined health status. The second group of lithography systems includes one or more of the plurality of lithography systems that are not in the first group of lithography systems.

Implementations may include one or more of the following features. The identified module may be configured to compare the information from the first group of lithography systems to a data threshold to determine a health status of the gaseous gain medium, and the data threshold may be configured to adapt during operation of the lithography system. The same data threshold may be applied to information from all of the lithography systems, and the data threshold for all of the lithography systems may be adapted during operation of the lithography system based on data from the first group of lithography systems.

The information from the first group of lithography systems may include information from the optical source of each lithography system in the first group of lithography systems.

In some implementations, each of the lithography systems further includes an optical lithography apparatus, and the information from the first group of lithography systems includes information from the optical source of each lithography system in the first group of lithography systems and from each optical lithography apparatus in the first group of lithography systems.

Implementations of any of the techniques described above and herein may include a process, an apparatus, a control system, instructions stored on a non-transient machine-readable computer medium, and/or a method. The details of one or more implementations are set forth in the accompanying drawings and the description below. Other features will be apparent from the description and drawings, and from the claims.

DETAILED DESCRIPTION

Figure 1:
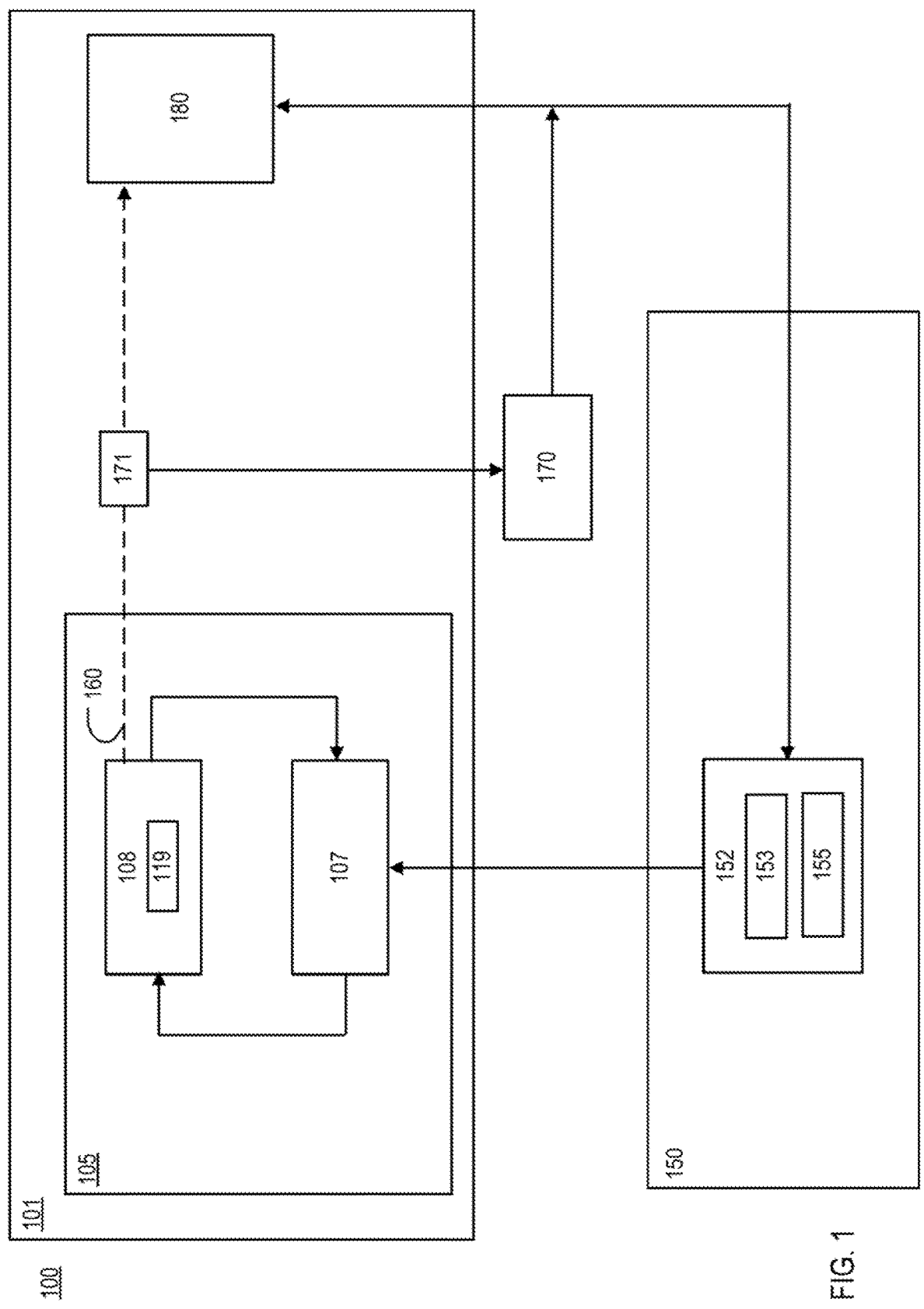
FIG. 1 is a block diagram of an example of a system that includes a lithography apparatus and a light source.

A gas monitoring system for a deep ultraviolet (DUV) optical lithography system (or photolithography system) is disclosed. FIG. 1 is a block diagram of a system 100. In the example of FIG. 1, solid lines connecting two elements indicate a data path over which data (for example, information and/or command signals) flow, and dashed lines indicate an optical path along which light propagates. The system 100 includes a lithography system 101 that includes an optical source 105 (or light source 105) and a lithography apparatus 180. The optical source 105 provides a pulsed light beam 160 to the lithography apparatus 180. The lithography apparatus 180 also may be referred to as a scanner or a lithography tool. The lithography apparatus 180 uses the pulsed light beam 160 to expose wafers.

The monitoring system 150 monitors the optical source 105 and/or the lithography apparatus 180 to optimize use of a gaseous gain medium 119. The monitoring system 150 relates the performance of the lithography system 101 to the health of the gaseous gain medium 119 and is thereby able to assess a health status of the gaseous gain medium 119. By assessing the health status of the gaseous gain medium 119, the monitoring system 150 enables the gaseous gain medium 119 to be used more efficiently and may reduce downtime of the system 100.

The pulsed light beam 160 is a train of pulses of light, with each pulse being formed by exciting the gaseous gain medium 119. The pulsed light beam 160 has a repetition rate. The repetition rate is the number of pulses of light that occur within a measure of time. For example, the repetition rate may be the number of pulses of light that occur within one second. The repetition rate is determined by the number of times that the gaseous gain medium 119 is excited within the measure of time. Additionally, the pulsed light beam 160 is associated with one or more specifications related to the quality of the pulsed light beam 160. The specifications may include, for example, acceptable values and/or ranges of values for various properties of the pulsed light beam 160. For example, the specifications may include values related to pulse energy, wavelength, repetition rate, and/or pulse duration, or values derived from measurements of any of these properties. When the pulsed light beam 160 is within the specification, all of the properties of interest to the application at hand are within the range or are equal to the value for that property as set forth in the specification. When the pulsed light beam 160 is not within specification, one or more of the properties of interest to the application at hand are outside of the range or not equal to the value for that property. The system 100 has optimal performance when the light beam 160 is within the specification.

The gaseous gain medium 119 his an actual gas lifetime and an assumed gas lifetime. The actual gas lifetime is a period during which the gaseous gain medium 119 is able to produce pulses of light that are within the specification. The assumed and actual gas lifetimes may be measured as, for example, a total number of pulses produced by the gaseous gain medium 119 or a total time during which the optical source 105 is operated at a specific repetition rate. When the gaseous gain medium 119 reaches the end of its actual gas lifetime, the gaseous gain medium 119 is no longer able to produce pulses of light that are within the specification.

The assumed gas lifetime is a conservative estimate of the actual gas lifetime based on knowledge of performance of optical systems that are similar to the optical source 105. The assumed gas lifetime is the same for all optical sources that use a particular type of gaseous gain medium, and the assumed gas lifetime is such that it is very unlikely that the gaseous gain medium in any optical source has an actual lifetime that is less than the assumed lifetime. However, individual optical sources and gaseous gain media experience different conditions during operational use. As such, the actual gas lifetime for a particular gaseous gain medium (such as the gain medium 119) may be different from the actual gas lifetime for another gaseous gain medium. Moreover, because the assumed gas lifetime is a conservative estimate, it is likely that the actual gas lifetime for a particular gaseous gain medium used under ordinary operating conditions is greater than the assumed gas lifetime.

In a typical optical source, the gaseous gain medium 119 is replaced when the assumed lifetime is reached using a procedure called a refill procedure. A refill procedure includes removing and replacing the gaseous gain medium 119. The optical source 105 cannot be operated during the refill procedure. Thus, it is desirable to reduce the number of refill procedures that are performed on the optical source 105. In the system 100 of FIG. 1, the monitoring system 150 determines a health status of the gaseous gain medium 119 based on one or more system performance metrics and/or measured properties of the pulsed light beam 160. The monitoring system 150 uses the health status to determine whether to extend use the gaseous gain medium 119 even if the assumed gas lifetime has occurred.

Furthermore, after the monitoring system 150 determines that the use of the gaseous gain medium 119 should be extended, the monitoring system 150 continues to determine the health status of the gaseous gain medium 119. In other words, the determination to extend the use of the gaseous gain medium 110 may be performed more than once such that the gaseous gain medium 119 is used as much as possible but not overused. Thus, the monitoring system 150 allows the optical source 105 to optimize use gaseous gain medium 119. In this way, the monitoring system 150 encourages conservation of resources and provides the possibility of reducing the number of refills.

The health status is determined based on system performance metrics and/or measured properties of the pulsed exposure beam 160. The system 100 includes a detection module 170 that is configured to receive and analyze data related to the pulsed light beam 160 and to produce a beam quality metric. In the example of FIG. 1, the detection module 170 receives the data related to the pulsed light beam 160 from a sensor 171. The sensor 171 is any sensor capable of measuring a property of the pulsed light beam 160. For example, the sensor 171 may be an energy sensor, a wavelength sensor, and/or a sensor that measures a spectral bandwidth of the beam 160. The data received and analyzed by the detection module 170 is any data related to a property of the pulsed light beam 160. For example, the data may be measurements of bandwidth, wavelength, energy, and/or dose. The sensor 171 may be positioned at any location where the beam 160 may be sensed. For example, the sensor 171 may be in the optical source 105, between the optical source 105 and the lithography apparatus 180, or in the lithography apparatus 180.

The beam quality metric is any information related to (or that can be used to determine) whether a property of pulsed exposure beam 160 meets the specification. For example, the beam quality metric may be binary numerical data that has only two possible values, with one of the values indicating that the property of the pulsed exposure beam 160 meets the specification and the other of the values indicating that the property of the pulsed exposure beam 160 does not meet specifications. In some implementations, the beam quality metric is numerical data that is not binary. For example, the beam quality metric may be measured values detected by the sensor 171. In yet another example, the beam quality metric may be a numerical value that represents a difference between a measured value and an expected or ideal value.

The detection module 170 provides the beam quality metric to the monitoring system 150 and also may provide the beam quality metric to the lithography apparatus 180. The monitoring system 150 includes an analysis module or a supervisor module 152 that analyzes the beam quality metric to determine the health status of the gaseous gain medium 119. In sonic implementations, the analysis module 152 also receives system performance metrics or data related to the operations of the controller 107 and analyzes this information to determine the health status. Additionally, the analysis module 152 also may receive information from other parts of the optical source 105 and/or the lithography apparatus 180, and this information also may be to determine the health status of the gain medium 119.

The health status of the gaseous gain medium 119 is an indication of whether the gain medium 119 is suitable for generating additional pulses of light, or whether the gain medium 119 is nearing or has reached the end of its actual gas lifetime. If the health status indicates that the gaseous gain medium 119 is at the end of the actual gas lifetime, then the monitoring system 150 provides a command signal to the gas subsystem 108 to perform a refill operation. Thus, the health status determined by the monitoring system 150 is based on measurements related to the light beam 160 and/or system performance data instead of being based on the assumed gas lifetime. As such, in situations in which the gaseous gain medium 119 has an actual gas lifetime that is greater than the assumed gas lifetime, the monitoring system 150 allows the gaseous gain medium to be used to its full potential and thereby reduces the frequency of refill operations and increases the operational time of the system 100.

Figure 2A:
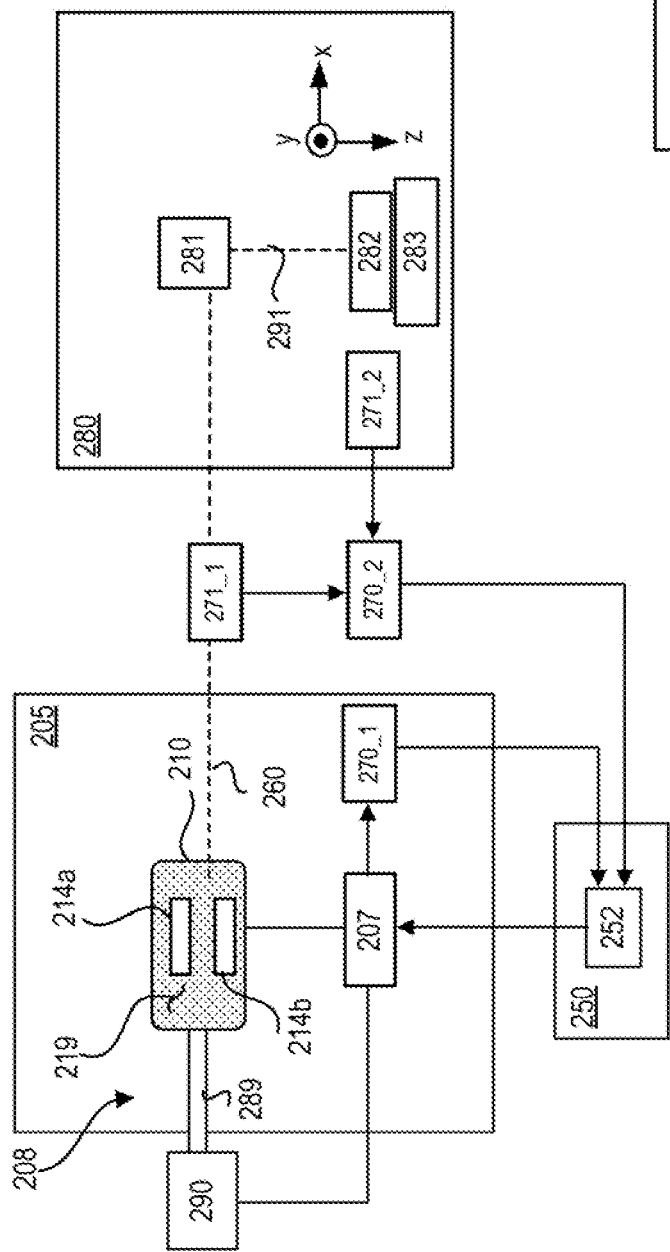
FIG. 2A is a block diagram of another example of a system that includes a lithography apparatus and a light source.

In the example of FIG. 1, the gaseous gain medium 119 is part of a gas subsystem 108. The gas subsystem 108 may include other components, such as a chamber that holds the gaseous gain medium 119, electrodes to excite the gaseous gain medium 119, and a conduit through which gas is injected into or removed from the chamber. FIG. 2A shows examples of the chamber, electrodes, and conduit. The optical source 105 also includes a controller 107 that controls low-level aspects of the gas subsystem 108 during operation of the optical source 105. For example, the gaseous gain medium 119 may include a halogen gas component that is depleted by producing pulses of light. In this example, the controller 107 manages injections of additional halogen gas into the gaseous gain medium 119 to maintain a certain amount of the halogen gas in the medium 119. The injections occur during normal operation of the optical source 105 and are distinct from a refill operation. The controller 107 may, for example, control the amount and frequency of injections of the halogen gas component into the gaseous gain medium 119. A controller 107 that controls the amount and frequency of injections of the halogen gas component is known and is present in some prior systems.

On the other hand, the system 100 also includes the monitoring system 150, which has capabilities that are above and beyond those of the controller 107. The monitoring system 150 is separate from the controller 107 but interacts with the controller 107. For example, the controller 107 may be programmed to cause a refill operation when the gaseous gain medium 119 has produced a fixed and predetermined threshold number of pulses. However, if the health status indicates that the gaseous gain medium 119 is suitable for use beyond the assumed gas lifetime, the monitoring system 150 commands the controller 107 to not perform a refill operation even though the fixed and predetermined threshold number of pulses have been produced.

The controller 107 may be, for example, a feedback or feed-forward controller implemented on an embedded processor. The monitoring system 150 is implemented on a general-purpose computer instead of an embedded processor. The monitoring system 150 has capabilities that the controller 107 does not have. An embedded processor is typically smaller than a general-purpose computer and uses less power. A general-purpose computer is capable of performing more complex calculations and storing a larger amount of data than an embedded processor. Thus, the monitoring system 150 is able to store a larger amount of data from the optical source 105 and analyze that data in more sophisticated ways than are possible with an embedded processor.

Additionally, the controller 107 operates on a different and separate time schedule than the monitoring system 150. For example, the controller 107 may operate on a relatively short time frame, for example, the controller 107 may perform many injection operations during the actual lifetime of the gaseous gain medium 119. The monitoring system 150 may monitor the optical lithography system 101, the controller 107, and/or the optical source 105 over a longer period of time than the controller 107 than the frequency at which the controller 107 operates on the gas subsystem 108. For example, the monitoring system 150 may monitor the controller 107, the optical lithography system 101, and/or the optical source 105 over a period of days, weeks, or months.

Figure 4:
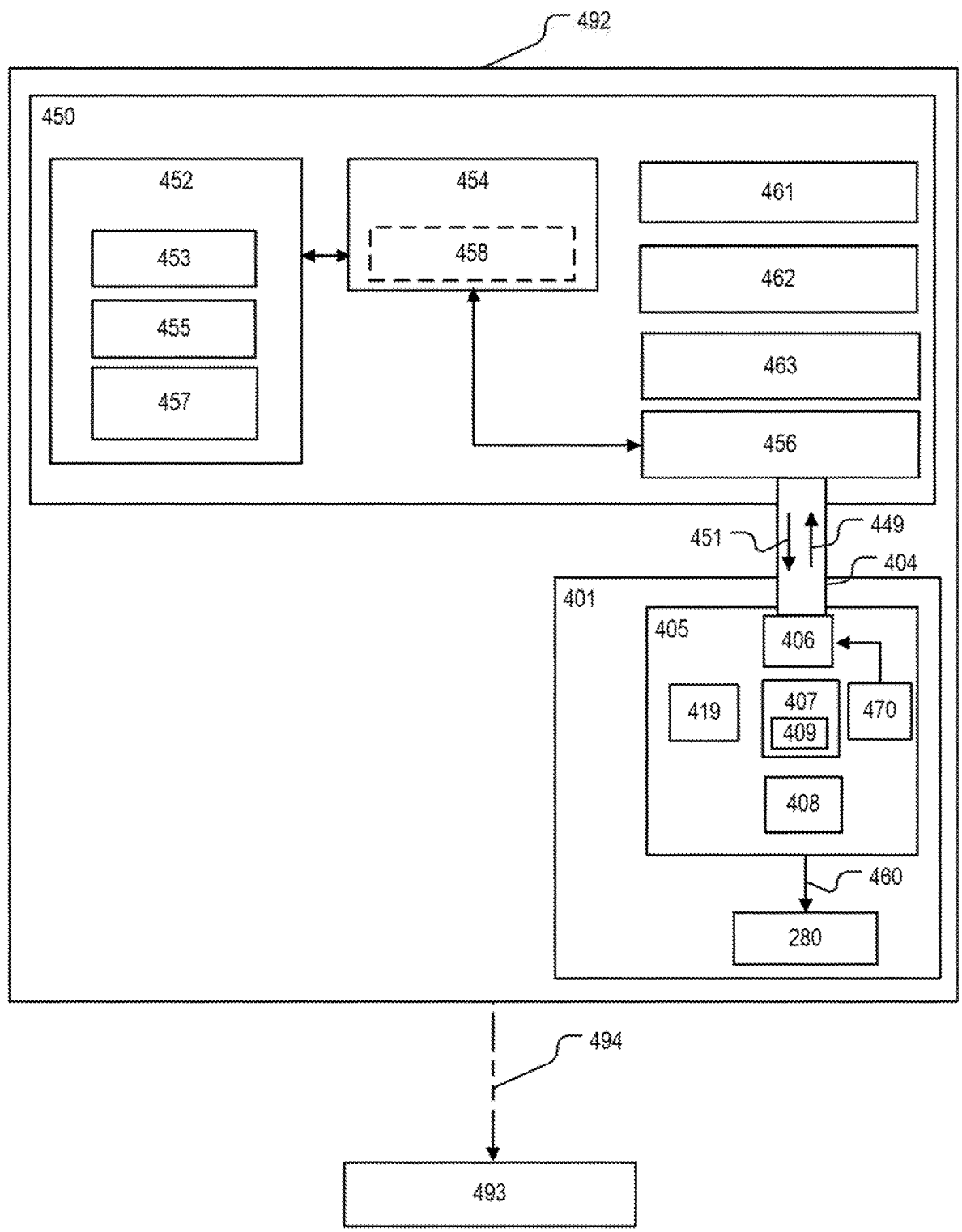
FIG. 4 is a block diagram of an example of a monitoring system.

Moreover, and as discussed further with respect to FIG. 4, the analysis module 152 employs a collection of rules 153 that associate an aspect or aspects of the gaseous gain medium 119 with various modules in a library of modules 155. Anything related to the performance of the optical source 105 and/or the lithography apparatus 180 that is impacted by the health of the gaseous gain medium 119 may be an aspect of the gaseous gain medium 119. The rules 153 allow the performance of the lithography system 101 to be characterized in a manner that is related to the health of the gaseous gain medium 119.

The aspects of the gaseous gain medium 119 may include observable properties of the light beam 160 and/or information about the light beam 160, the optical source 105, and/or the lithography apparatus 180 that are derivable from observable properties of the light beam 160. The aspects also may include system performance metrics related to the production of the light beam 160. For example, the number of pulses produced since the most recent refill operation may be an aspect of the gaseous gain medium 119. In another example, a size and frequency of injections of a replenishing gas mixture may be an aspect of the gaseous gain medium 119. In yet another example, the optical energy in a pulse may be an aspect of the gaseous gain medium 119.

The rules 153 associate one or more of the aspects with a module that is stored in the library of modules 155. The monitoring system 150 uses the rules 153 to select a particular module or modules from the library of modules 155. The monitoring system 150 executes the selected module or modules to determine the health status of the gain medium 119, and may generate a command signal for the optical source 105 and/or the controller 107. When the health status indicates that the gain medium 119 has reached the assumed end of gas lifetime but has not reached the end of the actual gas lifetime, the command signal acts on the optical source 105 to prevent a refill operation and to allow the gain medium 119 to continue to be used beyond the assumed gas lifetime.

Figure 2B:
FIG. 2B is a block diagram of an example of a projection optical system that may be used in the lithography apparatus of FIG. 2A.
Figure 3:
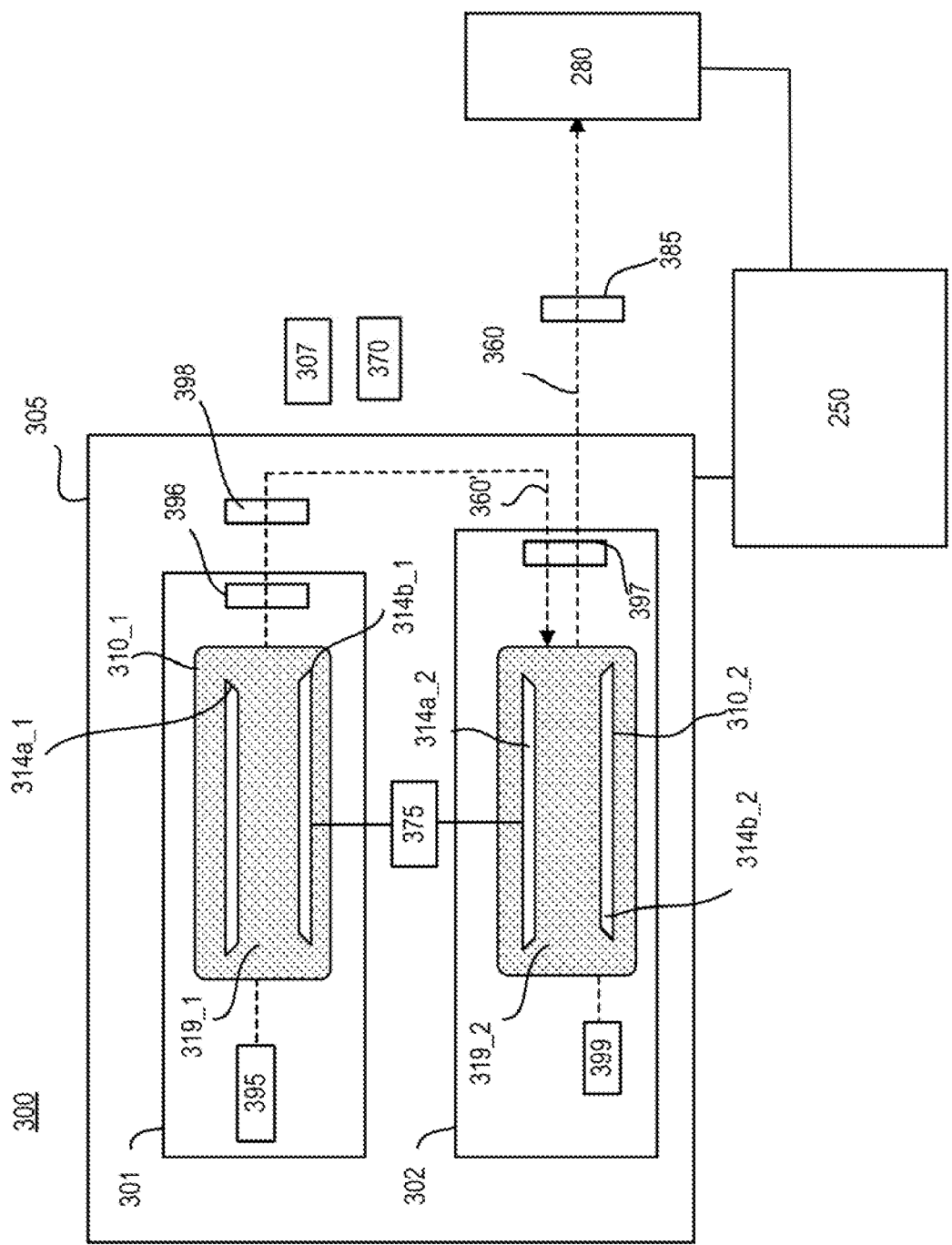
FIG. 3 is a block diagram of another example of a system that includes a lithography apparatus and a light source.

Example implementations of the optical source 105 and the lithography apparatus 180 are discussed prior to discussing the monitoring system 150 in greater detail with respect to FIG. 4. The example of FIG. 1 shows a single detection module 170. However, more than one instance of the detection module 170 may be included in the system 100. FIG. 2A is an example of a system 200, which includes an optical source 205 and a lithography apparatus 280, is an example of a system that includes more than one detection module. FIG. 2B shows the lithography apparatus 280 in greater detail. FIG. 3 is an example of a system 300, which includes a two-stage optical source 305. An example of a monitoring system 450 is discussed in greater detail with respect to FIG. 4.

Referring to FIGS. 2A and 2B, an optical system 200 includes an optical (or light) source 205 that provides a light beam 260 to a lithography apparatus 280. The optical source 205 is an example implementation of the optical source 105 (FIG. 1). The lithography apparatus 280 is an example implementation of the lithography apparatus 180 (FIG. 1).

The lithography apparatus 280 exposes a wafer 282 with an exposure light beam 291. The wafer is received by a wafer holder or stage 283. The exposure light beam 291 is formed by passing a light beam 260 through a projection optical system 281. The light beam 260 is generated by exciting a gaseous gain medium 219. A monitoring system 250 determines a health status of the gaseous gain medium 219 and may command a controller 207 to extend the use of the gaseous gain medium 219 beyond an assumed gas lifetime. The controller 207 is similar to the controller 107 (FIG. 1). The monitoring system 250 is an example of an implementation of the monitoring system 150. The monitoring system 250 includes an analysis module 252.

The optical source 205 includes a discharge chamber 210, which encloses a cathode 214a, an anode 214b, and a gaseous gain medium 219. A potential difference between the cathode 214a and the anode 214b forms an electric field in the gaseous gain medium 219. The electric field provides energy to the gain medium 219 sufficient to cause a population inversion and to enable generation of a pulse of light via stimulated emission. Repeated creation of such a potential difference forms the train of pulses of light that make up the light beam 260. A "discharge event" is the application of voltage that forms a potential difference sufficient to cause an electrical discharge in the gaseous gain medium 219 and the emission of a pulse of light. The assumed and actual gas lifetimes of the gaseous gain medium 219 may be measured in discharge events.

The discharge chamber 210, the gain medium 219, and a gas supply system 290 are part of a gas subsystem 208 that is controlled by a controller 207. The controller 207 controls the gas supply system 290 to remove gas from or inject gas into the discharge chamber 210 by controlling flow of the gas through a conduit 289 that is fluidly coupled to the discharge chamber 210. Only one gas discharge chamber 210 is shown in FIG. 2A. However, the optical source 205 may be implemented to include more than one discharge chamber. An example of a light source that includes two discharge chambers is shown in FIG. 3.

The lithography apparatus 280 includes a projection optical system 281 through which the light beam 260 passes prior to reaching the wafer 282, and a sensor system or metrology system that includes a sensor 271_2. The sensor 271_2 may be, for example, a camera or other device that is able to capture an image of the light beam 260 at the wafer 282, or an energy detector that is able to capture data that describes the amount of optical energy at the wafer 282 in the x-y plane. The lithography apparatus 280 may be a liquid immersion system or a dry system.

Microelectronic features are formed on the wafer 282 by, for example, exposing a layer of radiation-sensitive photoresist material on the wafer 282 with the exposure beam 291. Referring also to FIG. 2B, the projection optical system 281 includes a slit 284, a mask 285, and a projection objective, which includes a lens system 286. The lens system 286 includes one or more optical elements. The light beam 260 enters the lithography apparatus 280 and impinges on the slit 284, and at least some of the beam 260 passes through the slit 284 to form the exposure beam 291. In the example of FIGS. 2A and 2B, the slit 284 is rectangular and shapes the light beam 260 into an elongated rectangular shaped light beam (the exposure beam 291). A pattern is formed on the mask 285, and the pattern determines which portions of the shaped light beam are transmitted by the mask 285 and which are blocked by the mask 285. The design of the pattern is determined by the specific microelectronic circuit design that is to be formed on the wafer 282.

The optical system 200 also includes detection modules 270_1 and 270_2, both of which provide data to the monitoring system 250. The detection module 270_1 provides system performance data collected by the controller 207. For example, the detection module 270_1 may provide data related to the size and frequency of the injection operations. In another example, the detection module 270_1 may be or include a sensor that is configured to measure the concentration of a component of the gain medium 219. For example, the gain medium 219 may include fluorine, and the detection module 270_1 may be a sensor that is configured to measure the concentration of fluorine in the discharge chamber 210. At room temperature, fluorine is a gas of diatomic molecules and is represented by its molecular structure $F_2$. The term "fluorine" as used in this example therefore refers to molecular fluorine $F_2$ and the sensor is an $F_2$ sensor or an $F_2$ detector. The $F_2$ sensor may be in, for example, a reaction chamber (not shown) that is separate from the discharge chamber 210 but is fluidly connected to the interior of the discharge chamber 210. In this way, the $F_2$ sensor is able to sense the concentration of fluorine and provide data about the concentration of fluorine.

The detection module 270_1 may be implemented as a software module. For example, in implementations in which the detection module 270_1 provides data related to the size and frequency of the injection operations, the data that describes the size and frequency of the injection operations may be stored in memory on the controller 207 and accessed by the detection module 270_1. For example, the detection module 270_1 may periodically poll the controller 207. In some implementations, the controller 207 pushes the data to the detection module 270_1 every time an injection operation is performed. Other data may be received from the controller 207, depending on the configuration of the optical source 205. For example, in some implementations, the controller 207 also controls operation of the electrodes 214a,b, for example, by applying voltage to the electrodes 214a,b at regular intervals. In these implementations, the detection module 270_1 may retrieve or receive data indicating how many discharge events have occurred since the most recent refill of the discharge chamber 210.

The detection module 270_2 receives data related to the light beam 260 from a sensor 271_1. The sensor 271_1 measures a property of the light beam 260 such as, for example, bandwidth, energy, pulse duration, and/or wavelength. The measured property is provided to the detection module 270_2, which determines a beam quality metric from the measured data and provides the beam quality metric to the monitoring system 250.

The beam quality metric is any quantity related to a property of the light beam 260. For example, the beam quality metric may be the measured data from the sensor 271_1 or processed data based on measured data from the sensor 271_1. For example, the beam quality metric may be an average of the data received from the sensor over a specific period of time. In some implementations, the beam quality metric is binary numerical data that may have only one of two possible values. For example, the sensor 271_1 may be an energy sensor that is used to measure the dose, and the beam quality metric may have two values, one indicating that the dose is in specification and the other indicating that the dose is not in specification. The dose is an amount of optical energy delivered to an area. To determine the dose, the energy sensor measures the amount of energy over a period of time and also counts the number of pulses emitted from the discharge chamber 210 over that period of time. In these implementations, the sensor 271_1 may include a detector that measures energy and a beam splitter that is in the path of the light beam 260. The beam splitter directs a portion of the light in each pulse to the detector. The detector measures the amount of energy over a time period. Furthermore, the number of pulses that occur over the time period may be derived from the energy measured by the detector. For example, if the detected energy is greater than a threshold value, then a pulse is deemed to be present. If the detected energy is lower than the threshold, then a pulse is not present. Thus, the data from the sensor 271_1 may be used to determine a beam quality metric based on dose.

The system 200 also includes the sensor 271_2, which is inside the lithography apparatus 280. The sensor 271_2 is part of a metrology system that monitors properties of the exposure light beam 291 at the wafer 282. The sensor 271_2 may be, for example, a camera that captures images of the exposure beam 291 and/or an energy sensor that measures the energy at the wafer 282. The sensor 271_2 provides data to the detection module 270_2. The detection module 270_2 analyzes the data and produces a beam quality metric. The beam quality metric may be, for example, a total or average amount of energy at the wafer 282 over a period of time or a pre-defined number of pulses. The beam quality metric is provided to the monitoring system 250.

The example of FIG. 2A includes two detection modules, the detection modules 270_1 and 270_2. However, in other examples more or fewer detection modules may be used. For example, each of the sensors 271_1 and 271_2 may provide data to a separate detection module such that the system includes three detection modules in total. Additionally, the system 200 may include more sensors than the example of FIG. 2A, and each of those sensors may have a separate detection module. Moreover, in some implementations, only one detection module is used. In these examples, all data collected by sensors and/or controllers is provided to a single detection module that produces beam quality metrics based on the various received data.

Furthermore, the detection modules may be implemented in a different manner than shown in FIG. 2A. In the example of FIG. 2A, the detection modules 270_1 and 270_2 are shown as being separate from the monitoring system 250. However, in some implementations one or more of the detection modules is implemented as part of the monitoring system 250. Additionally, a detection module may be implemented as part of the sensor or control system from which it receives data.

Referring to FIG. 3, a block diagram of a system 300 is shown. The system 300 is an example of an implementation of the system 200 (FIG. 2A). The system 300 includes a two-stage an optical source 305. The optical source 305 produces a pulsed light beam 360, which is provided to the lithography apparatus 280. The system 300 also includes the monitoring system 250, which is connected to components of the optical source 305 as well as to the lithography apparatus 280 to monitor various aspects of the system 300 and to determine a health status of a gain medium 319_1 and/or a gain medium 319_2.

The optical source 305 is a two-stage laser system that includes a master oscillator (MO) 301 that provides a seed light beam 360' to a power amplifier (PA) 302. The MO 301 and the PA 302 are subsystems of the optical source 305 or systems that are part of the optical source 305. The power amplifier 302 receives the seed light beam 360' from the master oscillator 301 and amplifies the seed light beam 360' to generate a light beam 360 for use in the lithography apparatus 280. For example, the master oscillator 301 may emit a pulsed seed light beam, with seed pulse energies of approximately 1 milliJoule (mJ) per pulse, and these seed pulses may be amplified by the power amplifier 302 to about 10 to 15 mJ.

The master oscillator 301 includes a discharge chamber 310_1 having two elongated electrodes 314a_1 and 314b_1, a gain medium 319_1 that is a gas mixture, and a fan (not shown) for circulating the gas mixture between the electrodes 314a_1, 314b_1. A resonator is formed between a line narrowing module 395 on one side of the discharge chamber 310_1 and an output coupler 396 on a second side of the discharge chamber 310_1. The line narrowing module 395 may include a diffractive optic such as a grating that finely tunes the spectral output of the discharge chamber 310_1. The optical source 305 also includes a line center analysis module 398 that receives an output light beam from the output coupler 396. The line center analysis module 398 is a measurement system that may be used to measure or monitor the wavelength of the seed light beam 360'. The line center analysis module 398 may be placed at other locations in the optical source 305, or it may be placed at the output of the optical source 305. The line center analysis module 398 may provide data to a detection module 370, which determines a beam quality metric based on the data and then provides the beam quality metric to the monitoring system 250.

To excite the gaseous gain medium 319_1, a potential difference is formed between the electrodes 314a_1 and 314b_1. To excite the gaseous gain medium 319_2, a potential difference is formed between the electrodes 314a_2 and 314b_2. These two potential differences are formed at different times so that the seed light beam 360' passes through the gaseous gain medium 319_2 at a time when the medium 319_2 is excited and is able to amplify the seed light beam 360'. The actual difference between the times is Δt. The optimal difference between the times is Δt_opp. and the difference between the actual time difference and the optimal time difference (Δt−Δt_opp) is referred to as MOPA operating point. MOPA operating point is a system performance metric of the optical source 305 and is also related to an aspect of the gaseous gain media 319_1 and 319_2. Thus, data that includes the MOPA operating point may be provided to the monitoring system 250.

In the example of FIG. 3, a timing controller 375 controls the excitation of the gain mediums 319_1 and 318_2. For example, the timing controller 375 controls when the potential difference is formed across the electrodes 314a_1 and 314b_1 and when the 10 potential difference is formed across the electrodes 314a_2 and 314b_2. The timing controller 375 also tracks the MOPA operating point and provides data to the detection module 370, which provides the MOPA operating point data and/or data based on the MOPA operating point to the monitoring system 250.

The gaseous gain medium 319_1 may be any gas suitable for producing a light beam at the wavelength and bandwidth required for the application. For an excimer source, the gaseous gain medium 318_1 may contain a noble gas (rare gas) such as, for example, argon or krypton, a halogen, such as, for example, fluorine or chlorine and traces of xenon apart from a buffer gas, such as helium. Specific examples of the gas mixture include argon fluoride (ArF), which emits light at a wavelength of about 193 nm, krypton fluoride (KrF), which emits light at a wavelength of about 248 nm, or xenon chloride (XeCl), which emits light at a wavelength of about 351 nm. The excimer gain medium (the gas mixture) is pumped with short (for example, nanosecond) current pulses in a high-voltage electric discharge by application of a voltage to the elongated electrodes 314a_1, 314b_1.

The power amplifier 302 includes a beam coupling optical system 397 that receives the seed light beam 360' from the master oscillator 301 and directs the seed light beam 360' through a discharge chamber 310_2, and to a beam turning optical element 399, which modifies or changes the direction of the seed light beam 360' so that it is sent back into the discharge chamber 310_2. The beam turning optical element 399 and the beam coupling optical system 397 form a circulating and closed loop path in which the input into a ring amplifier intersects the output of the ring amplifier at the beam coupling optical system 397.

The discharge chamber 310_2 includes a pair of elongated electrodes 314a_2, 314b_2, a gaseous gain medium 319_2, and a fan (not shown) for circulating the gaseous gain medium 319_2 between the electrodes 314a_2, 314b_2. The gaseous gain medium 319_2 may be the same as the gaseous gain medium 319_1.

The output light beam 360 may be directed through a beam preparation system 385 prior to reaching the lithography apparatus 280. The beam preparation system 385 may include a bandwidth analysis module that measures various (such as the bandwidth or the wavelength) of the beam 360. The beam preparation system 385 also may include a pulse stretcher (not shown) that stretches each pulse of the output light beam 360 in time. The beam preparation system 385 also may include other components that are able to act upon the beam 360 such as, for example, reflective and/or refractive optical elements (such as, for example, lenses and mirrors), filters, and optical apertures (including automated shutters).

The system 300 also includes one or more controllers 307, each of which control a subsystem of the system 300. For example, an instance of the controller 307 may control when the optical source 305 emits a pulse of light or a burst of light pulses that includes one or more pulses of light and another instance of the controller 307 may control the various aspects of the lithography apparatus 280. In another example, an instance of the controller 307 may control the exposure of the wafer 282 (FIG. 2A) and thus may be used to control how electronic features are printed on the wafer 282. In some implementations, an instance of the controller 307 controls the scanning of the wafer 282 by controlling the motion of the wafer 282 and/or the mask 285 in the x-y plane (FIG. 2A). Moreover, the timing controller 375, which controls the occurrence of discharge events in the chambers 310_1 and 310_2, may be considered to be an instance of the controller 307.

The lithography apparatus 280 also may include, for example, temperature control devices (such as air conditioning devices and/or heating devices), and/or power supplies for the various electrical components. An instance of the controller 307 also may control these components. In some implementations, the controller 307 is implemented to control more than one sub-control system, with at least one sub-control system (a lithography controller) dedicated to controlling aspects of the lithography apparatus 280.

When the gain medium of the gaseous gain medium 319_1 or the gaseous gain medium 319_2 is pumped by applying voltage to the electrodes 314a_1, 314b_1 or 314a_2, 314b_2, respectively, the gaseous gain medium 319_1 and/or 319_2 emits light. When voltage is applied to the electrodes at regular temporal intervals, the light beam 360 is pulsed. Thus, the repetition rate of the pulsed light beam 360 is determined by the rate at which voltage is applied to the electrodes. The repetition rate of the pulses may range between about 500 and 6,000 Hz for most applications. In some implementations, the repetition rate may be greater than 6,000 Hz, and may be, for example, 12,000 Hz or greater.

In the example of FIG. 3, only one detection module 370 is illustrated. The detection module 370 may be implemented as shown in FIG. 3, with a single detection module that receives and process data from more than one source. However, more than one instance of the detection module 370 may be included in the system 300. For example. an instance of the detection module 370 may receive data from each of instance of the controller 307, from the beam preparation system 385, and/or from the timing controller 375. Thus, the system 300 may include many separate instances of the detection module 370. Additionally, although only one instance of the controller 307 is illustrated in the example of FIG. 3, the system 300 may include more than one instance of the controller 307, and each of these instances may control a separate subsystem of the system 300.

FIG. 4 is a block diagram of a monitoring system 450 that is used to determine whether or not to extend use of a gaseous gain medium 419. The monitoring system 450 is an example of an implementation of the monitoring system 150. The monitoring system 450 may be used with the system 200 (FIG. 2A) or the system 300 (FIG. 3). In the example of FIG. 4, the monitoring system 450 is coupled to an optical source 405 of an optical lithography system 401 through a data connection 404. In the example of FIG. 4, the monitoring system 450 and the optical lithography system 401 are located in the same plant 492. The plant may be, for example, a wafer fabrication facility, room, or location. In some implementations, the plant 492 may include locations that are physically separate (such as different buildings) but are protected by the same electronic firewall.

The lithography system 401 includes the optical source 405 and the lithography apparatus 280. The optical source 405 is similar to the optical source 105 or 205 (FIGS. 1 and 2A). The optical source 405 includes the gaseous gain medium 419. The optical source 405 provides a light beam 460 to the lithography apparatus 280. The light beam 460 is generated by providing sufficient energy to the gain medium 419 to cause a population inversion. The optical source 405 includes one or more detection modules 470 that receive data related to the light beam 460 and/or performance data and provide the data to the monitoring system 450 via the data connection 404.

In the example of FIG. 4, the monitoring system 450 receives information 449 from the optical source 405 and provides a command signal 451 to the optical source 405 through the data connection 404 and the data interface 406. The monitoring system 450 generates the command signal 451 based on the information 449 received from the optical source 405. The information received from the optical source 405 includes a beam quality metric or metrics and/or system performance data. The beam quality metrics are related to properties of the light beam 460, and the beam quality metrics are data that represent (or may be used to determine) whether or not a property of the light beam 460 meets a specification. The system performance data is any data related to the performance of the optical source 405. The system performance data is also related to the beam 460, but the system performance data includes data other than observable properties of the light beam 460. For example, the system performance data may include the size and rate of injections of replenishing gas provided to the optical source 405 during injection operations and/or the number of pulses generated since the most recent refill operation.

In some implementations, the lithography apparatus 280 includes a data interface (not shown in FIG. 4) similar to the data interface 406 such that the monitoring system 450 also receives information from the lithography apparatus 280. In these implementations, the monitoring system 450 uses a data connection similar to the data interface 406 to receive information 449 from the optical source 405 and the lithography apparatus 280. The data received from the lithography apparatus 280 may include beam metrics and/or system performance data.

The supervisor module 452 includes a collection of rules 453, a library of modules 455, and monitoring parameters 457. The library of modules 455 includes one or more modules that, when executed by the command signal engine 454, may produce the command signal 451. Each of the modules 455 may be, for example, a set of instructions that form a computer program or a subroutine. The modules 455 process and/or analyze the information 449 from the optical lithography system 401 to determine a health status of the gain medium 419. In particular, the modules determine whether the gain medium 419 is suitable to continue to produce pulses of light beyond the assumed gas lifetime of the gain medium 419.

The command signal engine 454 generates the command signal 451 based on the health status of the gain medium 419. If the health status indicates that the gain medium 419 may be used beyond the assumed gas lifetime, then the command signal 451 is sufficient to cause the optical source 405 to continue producing the light beam 460 without performing a refill option. If the health status indicates that the gain medium 419 is unsuitable for the use beyond the assumed gas lifetime, then the command signal 451 is sufficient to cause a refill operation. In some implementations, the health status is represented as a binary signal, with one value indicating a health status that is acceptable for producing pulses of light and the other value indicating a health status that is not acceptable for producing pulses of light. The health status signal may include numerical data and have possible values of, for example, "1" and "0", or the health status signal may include character data and have possible values of, for example, "good" or "bad" or "extend" or "refill."

At any given time, the command signal engine 454 executes one or more of the modules in the library of modules 455. In some implementations, the command signal engine 454 executes one module at a time. In FIG. 4, the module executed by the command signal engine 454 is shown as a dashed rectangle and labeled 458. The collection of rules 453 governs which module or modules the command signal engine 454 executes.

Each rule in the collection of rules 453 associates one or more modules in the library of modules 455 with an execution criteria that is related to an aspect of the gaseous gain medium 419. The collection of rules 453 may include, for example, rules that are time-based and rules that are event-based. The execution criteria of a time-based rule is based on the passage of a pre-defined amount of time. The execution criteria of an event-based rule is based on the occurrence of an event within the optical lithography system 401. For example, a time-based rule may indicate that the command signal engine 454 execute a certain module from the library of modules 455 each week or after a defined amount of time has passed since the previous execution of that module. An event-based rule may indicate that the command signal engine 454 execute a certain module from the library of modules 455 when the information 449 from the optical lithography system 401 indicates that a set number of pulses of light have been provided to the lithography apparatus 280.

The supervisor module 452 also includes the monitoring parameters 457. The monitoring parameters 457 are variables, settings, and/or quantities that govern the actions performed by the command signal engine 454 when the modules in the library of modules 455 are executed. Any of the monitoring parameters 457 may be used by more than one of the modules in the library of modules 455. The monitoring parameters 457 may be considered to be variables that are called or referenced by one or more of the modules. The monitoring parameters 457 may include, for example, module configuration parameters, configurations for time and event based rules, data feed rules, and/or protection filters.

The module configuration parameters are any values that are used to specify details of a behavior or action taken by a module. A configuration parameter may be, for example, a range of values used by a module that applies a threshold test to information from the optical lithography system 401 to determine whether a particular condition exists in the optical source 405. In some implementations, a module that monitors an aspect of the optical source 405 may analyze information from the optical lithography system 401 by comparing the data to the range of values. For example, the module may analyze data that indicates a bandwidth, energy, and/or wavelength of the light beam 460 relative to a specification. In this example, the pre-defined range of values is the performance specification associated with the optical source 405. If the data from the optical source 405 indicates that the bandwidth, energy, and/or wavelength do not equal the specification, the health status is determined to be poor, and the command signal 451 is generated and provided to the optical source 405 to trigger a refill operation.

In some implementations, the module compares the data from the optical lithography system 401 to the specification and determines an error metric. The error metric for any particular property of the beam 460 may be, for example, the difference between the specified or expected value and the measured value. The error metric is compared to an error threshold. Each property may have a corresponding error metric, and the error metrics for each property may be different values. If the error metric for a particular property is less than the error threshold for that error metric, then the property is considered to meet the specification. If the error metric for a particular property is greater than or equal to the error threshold for that error metric, then the property is considered to be out of specification or to not meet the specification.

More than one property may be considered to determine the health status of the gaseous gain medium 419. For example, the bandwidth, energy, and wavelength of the light beam 460 (and/or the error metrics corresponding to these properties) may be considered as part of determining the health status. In some implementations, the health status is considered "good" if a threshold number of error metrics are less than a respective error threshold.

Furthermore, data other than data directly related to a property of the light beam 460 may be used to determine the health status of the gaseous gain medium 419. For example, system performance data (such as data from a controller 407 discussed below), also may be used by the monitoring system 450 to determine the health status of the gain medium 419. In another example, a count of a total number of pulses produced since the most recent refill event is also used to determine the health status of the gaseous gain medium 419 or used to determine whether to determine the health status at all. Moreover, the monitoring system 450 is capable of handling a much larger amount of data than a system implemented on, for example, an embedded processor. As discussed below, the ability of the monitoring system 450 to handle large amounts of data allows the monitoring system 450 to monitor the lithography system 401 over a longer period of time than is practical with a system implemented on, for example, an embedded processor (such as the controller 407). Furthermore, the enhanced data bundling abilities allow the monitoring system 450 to monitor multiple instances of the lithography system 401.

Additionally, the module may perform other actions. For example, the module may generate a log file that is stored at the electronic storage 462. In another example, module configuration parameters may contain information about which modules in the library of modules 455 are in an active state. That is, module configuration parameters may be used to enable or disable one or more modules in the library of modules 455.

The monitoring parameters 457 may also include configurations for time and event based rules that cause modules from the library of modules 455 to be executed by the command signal engine 454. In one example, a configuration for a time based rule is a particular amount of time that specifies how often a module is to be executed. In another example, a configuration for an event-based rule is a particular value of an operating parameter of the optical lithography system 401 that must be exceeded in order to execute a corresponding module. For example, in some implementations, the gaseous gain medium 419 is assumed to be "good" for a certain portion of the assumed gas lifetime. In these implementations, beam quality metrics and/or system performance metrics are not analyzed until a certain number of pulses of light have been generated by the optical source 405.

Data feed rules encompass another type of monitoring parameter 457 that specifies a data transfer action (for example, a transfer of data from the optical lithography system 401 to the monitoring system 450 via the data connection 404) that is to occur based on an event or the passage of a certain amount of time. For example, a data feed rule may specify that a certain operating parameter of the optical lithography system 401 should be transferred to the monitoring system 450 over the data connection 404 based on the occurrence of a certain event or a passage of a certain amount of time.

In some implementations, all or some of the monitoring parameters 457 are accessible to the operator of the monitoring system 450 such that the operator is able revise and/or add to the rules and/or the modules in the library of modules 455. In other implementations, the monitoring parameters 457 are not accessible to the operator of the monitoring system 450 and are set by the manufacturer at the time that the monitoring system 450 is commissioned. In yet other implementations, the monitoring parameters 457 are not accessible to the operator but may be changed based on pre-defined internal rules that are present when the monitoring system is commissioned.

The monitoring system 450 is implemented on a general purpose computer that includes an electronic processor 461, an electronic storage 462, and an I/O interface 463. The electronic processor 461 includes one or more processors suitable for the execution of a computer program such as a general or special purpose microprocessor, and any one or more processors of any kind of digital computer. Generally, an electronic processor receives instructions and data from a read-only memory, a random access memory (RAM), or both. The electronic processor 461 may be any type of electronic processor. The electronic processor 461 executes the instructions that make up the supervisor module 452, the command signal engine 454, the rules in the collection of rules 453, and the modules in the library of modules 455.

The electronic storage 462 may be volatile memory, such as RAM, or non-volatile memory. In some implementations, and the electronic storage 462 includes non-volatile and volatile portions or components. The electronic storage 462 may store data and information that is used in the operation of the monitoring system 450. For example, the electronic storage 462 may store the collection of rules 453, the library of modules 455, and the monitoring parameters 457. Instructions (for example, in the form of a computer program) that implement the supervisor module 452 and the command signal engine 454 also may be stored on the electronic storage 462. The electronic storage 462 also may store the information 449 received from the optical lithography system 401 and/or command signals 451 provided to the optical source 405.

The electronic storage 462 also may store instructions, perhaps as a computer program, that, when executed, cause the processor 461 to communicate with components in the optical source 405 and/or the lithography apparatus 280. For example, the instructions may be instructions that cause the electronic processor 461 to provide the command signal 451 generated by the command signal engine 454 to the optical source 405. In another example, the electronic storage 462 may store instructions that, when executed, cause the monitoring system 450 to interact with a separate machine. For example, the monitoring system 450 may interact with other optical lithography systems in the same plant 492. An example of a monitoring system that interacts with more than one optical lithography system is discussed with respect to FIG. 5.

In some implementations, the monitoring system 450 may send data to a remote station 493 via a data link 494. The remote station 493 may be, for example, a computer server. The remote station 493 is not within the plant 492, and the remote station 493 is not configured to provide commands to the optical source 405 or any other part of the optical lithography system 401. The data link 494 may be any communications channel capable of transmitting data the plant 492 to a location outside of the plant 492. The data link 494 may transmit data via the Supervisory Control and Data Acquisition (SCADA) protocol or another services protocol, such as Secure Shell (SSH) or the Hypertext Transfer Protocol (HTTP).

The I/O interface 463 is any kind of interface that allows the monitoring system 450 to exchange data and signals with an operator, the optical source 405, one or more components of the optical source 405, the lithography apparatus 280, and/or an automated process running on another electronic device. For example, in implementations in which the monitoring parameters 457 may be edited, the edits may be made through the I/O interface 463. The I/O interface 463 may include one or more of a visual display, a keyboard, and a communications interface, such as a parallel port, a Universal Serial Bus (USB) connection, and/or any type of network interface, such as, for example, Ethernet. The I/O interface 463 also may allow communication without physical contact through, for example, an IEEE 802.11, Bluetooth, or a near-field communication (NFC) connection. The I/O interface 463 also may be used to connect the monitoring system 450 to the data link 494 and the remote station 493.

The command signal 451 is provided to the optical source 405 through the data connection 404. The data connection 404 may be a physical cable or other physical data conduit (such as a cable that supports transmission of data based IEEE 802.3), a wireless data connection (such as a data connection that provides data via IEEE 802.11 or Bluetooth), or a combination of wired and wireless data connections. The data that is provided over the data connection may be set through any type of protocol or format. For example, file transfer protocol (FTP) or the common object request broker architecture (CORBA) may be used to transmit the command signal 451 to the optical source 405 and/or receive the information 449 from the optical source 405.

The data connection 404 is connected to the data interface 456 of the monitoring system 450 and the data interface 406 of the optical source 405. The data interfaces 456 and 406 may be any kind of interface capable of sending and receiving data. For example, the data interfaces 456 and 406 may be an Ethernet interface, a serial port, a parallel port, or a USB connection. The data interfaces 456 and 406 may allow data communication through a wireless data connection. For example, the data interfaces 456 and 406 may be an IEEE 811.11 transceiver, Bluetooth, or an NFC connection. The data interfaces 456 and 406 may be identical data interfaces, or the data interfaces 456 and 406 may each have a different form. For example, the data interface 456 may be an Ethernet interface, and the data interface 406 may be a parallel port. In the example of FIG. 4, the data interface 406 is shown with the optical source 405. However, the lithography apparatus 280 also may have a data interface configured for communication with the monitoring system 450.

The optical source 405 includes the data interface 406, the control system 407 in communication with the data interface 406, and a subsystem 408 that is controlled by the control system 407. FIG. 4 shows one data interface 406, control system 407, and subsystem 408. However, the optical source 405 may include more than one data interface 406, control system 407, and/or subsystem 408.

The subsystem 408 is any type of system that is controllable to generate and/or direct the light beam 460 and/or control the gain medium 419. The subsystem 408 may include controllable physical devices, a system that is implemented in software, or a system that includes hardware and software aspects. For example, the subsystem 408 may be a collection of optical elements (such as prisms, mirrors, and/or lenses and associated mechanical components) that focus and steer the light beam 460 within the optical source 405 and/or toward the lithography apparatus 280. In this example, the control system 407 may modify operating parameters related to the subsystem 408, such as the position, location, and/or orientation of the mechanical components to orient the optical components. In another example, the subsystem 408 may be a timing system that causes the optical source 405 to produce pulses of light at a particular repletion rate. The timing system may be implemented as software in, for example, a field-programmable gate array (FPGA) in the optical source 405 that communicates with the control system 407. In this example, the control system 407 may change the operating parameters of the timing system such that the repetition rate is changed. In yet another example, the control system 407 controls aspects of the gaseous gain medium 419, such as the formation of the potential difference between the electrodes, injection operations, and refill operations.

The control system 407 is an electronic and software-based control system implemented on an embedded processor 409. The embedded processor 409 has different characteristics than the electronic processor 461 of the monitoring system 450. The embedded processor 409 is a real-time processor that is fast enough to execute control systems at least once per pulse of light generated by the optical source 405. Furthermore, the embedded processor 409 may consume less power and may be smaller than the electronic processor 461. The embedded processor 409 may include a central processing unit (CPU) and memory. However, the embedded processor 409 has less general processing power than the electronic processor 461, and less memory is available as compared to the electronic storage 462. Thus, the monitoring system 450 is able to perform computations that are more complex than the embedded processor 409 and is able to store more data. This allows the monitoring system 450 to perform data analysis that is challenging or impossible for the embedded processor 409 to perform. For example, the monitoring system 450 may analyze data that is collected from the optical source 405 over a period of days, weeks, and months.

The control system 407 is separate from the monitoring system 450, and the control system 407 is able to control the subsystem 408 independently of the command signal 451. However, the control system 407 is in communication with the data interface 406, and may receive information or commands from the monitoring system 450 through the data interface 406. For example, the control system 407 may change an operating parameter in the subsystem 408 based on information in the command signal 451 such that the monitoring system 450 is able to temporarily control the control system 407. In another example, the command signal 451 may change an operating parameter of the control system 407.

Figure 5:
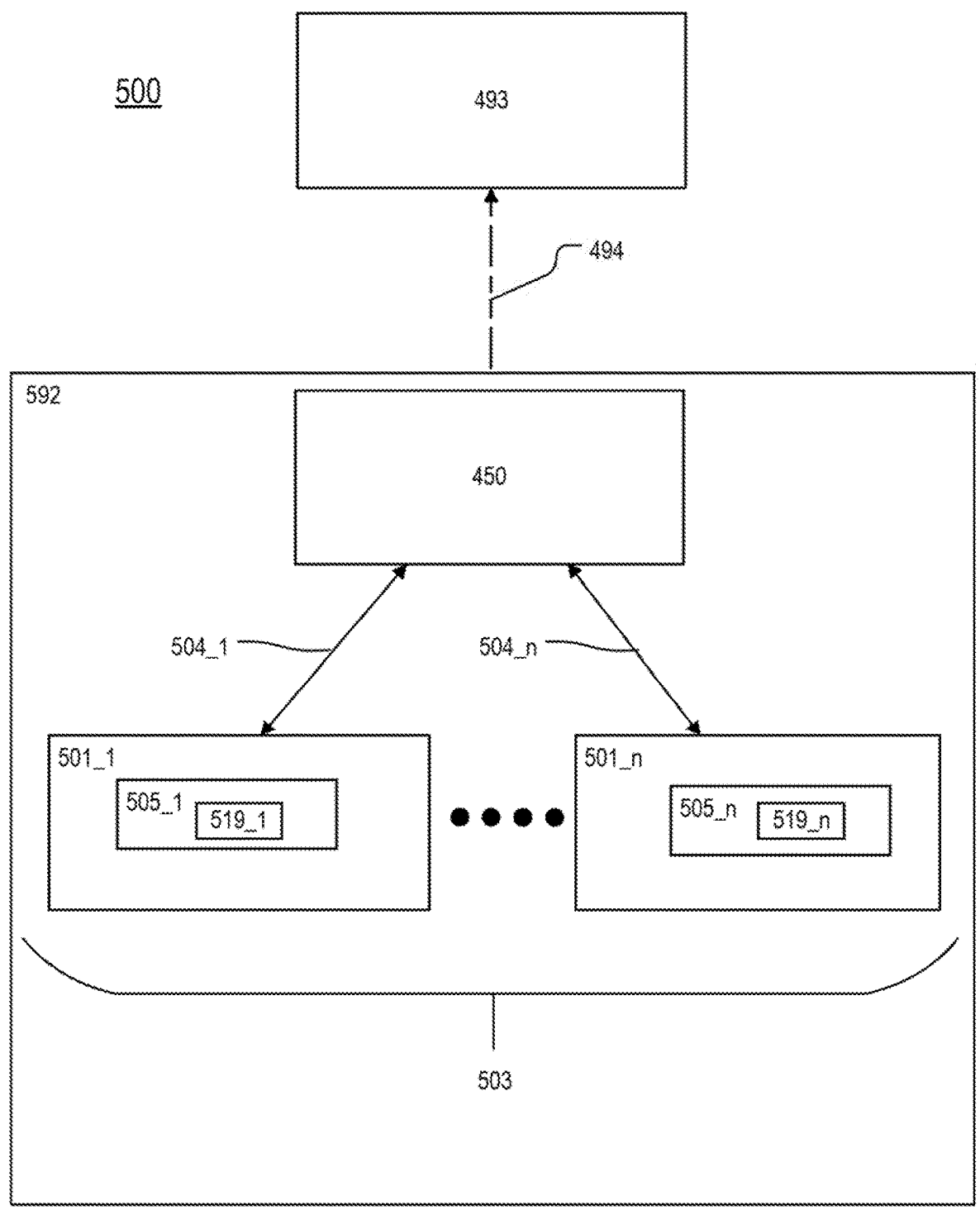
FIG. 5 is a block diagram of an example of a monitoring system monitoring a plurality of optical lithography systems.

FIG. 5 is a block diagram of a system 500. The system 500 includes the monitoring system 450. FIG. 5 shows an example of the monitoring system 450 being used to monitor more than one optical lithography system. In the example of FIG. 5, the monitoring system 450 is coupled to optical lithography systems 501_1 to 501_n (each of which includes a respective optical source 505_1 to 505_n) via a respective data connection 504_1 to 504_n. Each of the optical sources 505_1 to 505_n contains a respective gaseous gain medium 519_1 to 519_n and may be similar to the optical source 105 (FIG. 1), the optical source 205 (FIG. 2A), the optical source 305 (FIG. 3), or the optical source 405 (FIG. 4). Each of the data connections 504_1 to 504_n may be similar to the data connection 304 (FIG. 3).

The optical lithography systems 501_1 to 501_n are part of a group 503. The group 503 includes an optical lithography systems, where n is any number greater than zero. In the example shown in FIG. 5, the optical lithography systems 501_1 to 501_n are within the same plant 592. The plant 592 may be, for example, a wafer fabrication facility, room, or location. In some implementations, the plant 592 may include locations that are physically separate (such as different buildings) but are protected by the same electronic firewall. In some implementations, the systems 501_1 to 501_n in the group 503 may be disbursed in several different plants. For example, the systems 501_1 to 501_n may be systems that are owned by the same corporate entity, or systems that are used in the same way regardless of ownership or location.

The monitoring system 450 receives information from any or all of the optical lithography systems 501_1 to 501_n, analyzes the data, and provides command signals to any or all of the optical sources 505_1 to 505_n. In some implementations, the monitoring system 450 may provide data to the remote station 493 via the data link 494.

The monitoring system 450 is thus able to monitor a single lithography system or a plurality of lithography systems. By monitoring a plurality of lithography systems, the monitoring system 450 is able to learn characteristics and behaviors of one lithography system and may control other, similar lithography systems based on the learned characteristics and behaviors. For example, the monitoring system 450 may monitor the gaseous gain medium in one subset of a group of identical optical sources and determine that the gain mediums in those sources is able to be used beyond an assumed gas lifetime. The monitoring system 450 may then determine that the gaseous gain media of the other optical sources that are in the group but are not in the subset also should be extended beyond the assumed gas lifetime. The ability of the monitoring system 450 to monitor more than one lithography system may provide performance benefits. For example, a specific unhealthy signature may be detected on one optical source, and the monitoring system 450 is then able to look for that same unhealthy signature on all other optical sources coupled to the monitoring system, thereby improving the performance of all of the optical sources. Thus, the monitoring system 450 improves the overall performance of the system 400 by allowing a faster and/or more efficient adjustment as compared to a system in which only a single optical system is monitored.

Figure 6:
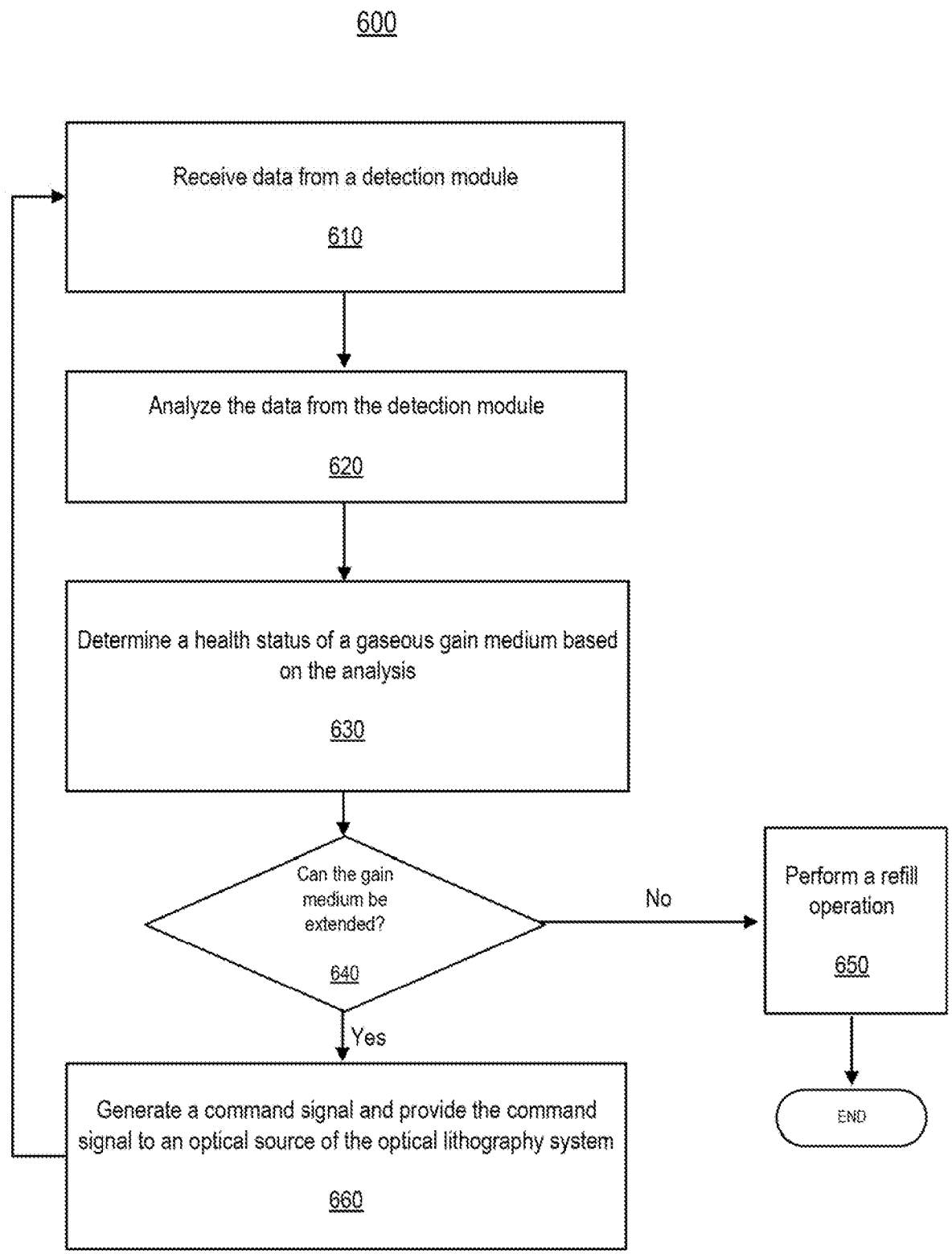
FIG. 6 is a flow chart of an example of a process performed by a monitoring system.

Referring to FIG. 6, a flow chart of a process 600 is shown. The process 600 is an example of a process that may be performed by the monitoring system 150 or 450. The process 600 is discussed with respect to the monitoring system 450 (FIGS. 4 and 5) and the system 200 (FIGS. 2A and 2B). In the discussion below, the optical source used in the system 200 includes two chambers: a master oscillator and a power amplifier.

Data is received from a detection module (610). The monitoring system 250 may receive data from the detection module 270_1 or the detection module 270_2. The received data may be any type of data related to the gaseous gain medium. In the example of FIG. 6, the data received from the detection module 270_2 are beam quality metrics and/or system performance data. The data received from the detection module 270_1 is system performance data. The beam quality metrics are metrics that are determined based on measured properties of the light beam 260. In the example of FIG. 6, the beam quality metrics are based on a measured bandwidth of the light beam 260 and a measured energy of the light beam 260. Thus, the sensor 271_1 and/or the sensor 271_2 include bandwidth, energy detectors, and/or time detectors.

In the example discussed below, the beam quality metrics are bandwidth, energy error, bandwidth unlocks, and energy unlocks. The bandwidth is the E95 bandwidth, which is the spectral bandwidth that includes 95% of the total energy in a pulse of light. The energy error is the difference between the measured energy of the pulse and the expected (or specified) energy. An unlock is a single occurrence corresponding to a condition related to energy or bandwidth that is outside of the specification. For example, a bandwidth unlock occurs when the E95 bandwidth of a pulse exceeds a specification for the E95 bandwidth.

The example of FIG. 6 also uses system performance metrics, which are based on data other than beam quality metrics, to determine the health status. In this example, the system performance metrics are MOPA operating point and size of gas injections. As noted above, for the purposes of FIG. 6, the optical source 205 is a two-stage system and includes a master oscillator and a power amplifier. The system performance metrics include the MOPA operating point, which is a distance between Δt_opp (which is an ideal temporal difference between a discharge event in the master oscillator and a discharge event in the power amplifier) and Δt (which is the actual temporal difference between the discharge event in the master oscillator and the discharge event in the power amplifier). The controller 207 provides the timing information to the detection module 270_1, which determines the MOPA operating point data and provides the data to the monitoring system 250. The other system performance metric is the size of gas injections made during operation of the optical source 205. The controller 207 provides data regarding the size of replenishing gas injections made during operation of the optical source 205 to the detection module 270_1.

The detection module 270_2 determines beam quality metrics based on the bandwidth and energy data received from the sensor 271_1 and/or the sensor 271_2. In this example, the bandwidth beam quality metric includes two signals, one related to the maximum value of the bandwidth over a finite period of time and the other related to the minimum value of the bandwidth over a finite period of time. The specification for the bandwidth may be a range of values centered on an ideal bandwidth. When the gain medium 219 is healthy, the minimum and maximum bandwidths are both close to the ideal bandwidth. Thus, the difference between the highest specified bandwidth and the maximum measured bandwidth, and the difference between the lowest specified bandwidth and the minimum measured bandwidth provides an indication of whether the gain medium 219 is healthy, and, if the gain medium 219 is healthy, how close the gain medium 219 is to unhealthy.

The detection module 270_2 also determines the energy error beam quality metric. The data used to determine the energy error beam quality metric is measured energy of a pulse of light, and the energy error beam quality metric is a value that represents a difference between an expected or specified energy and the measured energy. Further, the detection module 270_2 determines the beam quality metrics for energy and bandwidth unlocks by counting occurrences of energy unlocks over a time period and bandwidth unlocks over a time period.

In another example, the detection module 270_2 determines beam quality metrics from data that is derived from the measured energy and/or the measured bandwidth. For example, a quantity called energy sigma may be derived from the measured energy and used to determine a beam quality metric. To determine energy sigma, the energy is measured for each of a plurality of pulses. The energy in each pulse is compared to the specified or expected energy to determine an energy error for each pulse. The standard deviation of the energy error over all of the plurality of pulses is determined from the energy error for each pulse, and the standard deviation is the energy sigma. The energy sigma may be determined continuously during operation of the system 200. In other words, the energy sigma based on different sets of pulses, each having the same number of pulses, may be determined throughout operation of the system 200. The energy sigma also has a specified value. Other derived metrics and quantities may be used to determine the beam quality metric. For example, a moving average of the energy or the energy sigma may be used to determine the beam quality metric.

The data received from the detection modules 270_1 and 270_2 is analyzed (620). For example, each of the beam quality metrics and system performance metrics includes at least one signal that includes numerical data. The data may be analyzed by comparing the data in each signal to a threshold that is specific to that type of data. For example, the number of bandwidth unlocks is compared to a threshold that is specific to bandwidth unlocks, with a number that falls below the threshold indicating a healthy gain medium 219 and a number that is above or equal to the threshold indicating an unhealthy gain medium 219. In this example, the analysis of the beam quality metric produces a binary signal that has only two possible values: one that indicates that the bandwidth unlocks exceeded or met the threshold, and the other that indicates that there were fewer than the threshold number of bandwidth unlocks.

The system performance data is also analyzed by the monitoring system 250. For example, the gas injection data is analyzed to determine if an amount of injected gas exceeds a threshold. Exceeding the threshold may indicate that the gain medium 219 does not have the proper amount of one or more gas components. Thus, in this example, exceeding the threshold indicates that the gain medium 219 may be unhealthy.

In some implementations, the threshold is adaptive and is able to change during operation of the system 200. For example, in implementations in which the monitoring system 250 monitors more than one instance of the system 200, the threshold or specification to which data is compared may change based on information obtained from other instances of the system 200 and/or from other instances of components of the system 200. In another example, for a certain number of discharge events after a refill event, the gaseous gain medium 219 is assumed to be ideal or near-ideal. Thus, the optical beam 260 produced after a refill is also assumed to be optimal. If information from the optical source 205 indicates that performance data (such as information related the injection operations) is above a threshold during this period, and most or all of the properties of the beam 260 are within specification, it is an indication that the existing thresholds related to the performance data are not correct and may be changed to reflect that the present value of the property being measured is acceptable.

The health status of the gain medium 219 is determined based on the analyzed data (630). In the example of FIG. 6, the analyzed data includes the analyzed beam quality metrics and the system performance metrics. All of the analyzed data may be used to determine the health status based on pre-determined criteria. For example, a criteria may specify that if any two of the beam quality metrics indicate that the gain medium is not healthy, then the health status is "0", "bad", or "unhealthy." In another example, the criteria may specify if any of the metrics of any type indicate that the gain medium 219 is not healthy, then the health status is "0", "bad", or "unhealthy." In yet another example, the criteria may specify that if only one of the metrics indicate that the gain medium 219 is not healthy, then the health status is "1", "good", or "extend." In this example, use of the gain medium 219 is extended beyond the assumed gas lifetime, and the use of the gain medium 219 is terminated at any point thereafter when the gain medium 219 has deteriorated and is no longer healthy.

At (640), it is determined whether or not use of the gain medium 219 is to be extended beyond the assumed gas lifetime or continued to be used regardless of the assumed gas lifetime. The health status determined in (630) is compared to known values possible values of the health status to determine whether or not to extend use of the gain medium 219. For example, the gain medium 219 is extended if the health status is "good" or "1." The gain medium is not extended or continued to be used if the health status is "bad" or "0."

If the health status is not determined to be good, the monitoring system 250 issues a command signal 451 that causes a refill operation to occur (650). The optical source 205 is shut down and stops producing the light beam 260 in preparation for the refill operation. After the refill operation, the optical source 205 resumes normal operation and again produces the light beam 260.

If the health status is determined to be good, the monitoring system 250 issues a command signal 451 that overrides the settings in the controller 207 such that the optical source 205 continues to produce the light beam 260 even if the assumed lifetime is over (660). The process 600 continues until the health status of the gain medium 219 is determined to not be healthy, at which point the monitoring system 250 issues a command signal 451 that causes a refill operation to occur (650).

The above is provided only as an illustration, and additional and/or different data may be used in the process 600. For example, in some implementations, the process 600 is only performed after a threshold number of pulses have been produced by the optical source 205 since the most recent refill operation. In these implementations, the monitoring system 250 also receives an indication of the number of produced pulses from the detection module 270_1 and/or 270_2 and only performs (620) and (630) if the number of produced pulses exceeds the threshold.

Furthermore, the process 600 may be applied to a system in which the monitoring system 450 monitors more than one lithography system, such as illustrated in FIG. 5.

The embodiments may further be described using the following clauses:

1. A system comprising:
   an optical source configured to emit a pulsed light beam, the optical source comprising one or more chambers, each of the one or more chambers configured to hold a gaseous gain medium, the gaseous gain medium being associated with an assumed gas life;
   at least one detection module configured to:
   receive and analyze data related to the pulsed light beam, and
   produce a beam quality metric based on the data related to the pulsed light beam; and
   a monitoring module configured to:
   analyze the beam quality metric,
   determine a health status of the gaseous gain medium based on the analysis of the beam quality metric, and
   produce a status signal based on the determined health status, the status signal indicating whether to extend use of the gaseous gain medium beyond the assumed gas life or to end use of the gaseous gain medium.

2. The system of clause 1, wherein analyzing the beam quality metric comprises determining whether the pulsed light beam meets a pre-determined specification, and the beam quality metric comprises an optical energy of the pulsed light beam, a spectral bandwidth of the pulsed light beam, and/or a wavelength of the pulsed light beam.

3. The system of clause 2, wherein the at least one detection module comprises a plurality of detection modules, the plurality of detection modules comprising:
   a discharge count detection module configured to detect an occurrence of a discharge event in any of the one or more chambers and to produce a signal that indicates a count of discharge events over a period of time;
   a bandwidth detection module configured to detect a spectral bandwidth of the pulsed light beam and to produce a signal that indicates a spectral bandwidth of the pulsed light beam;
   an energy detection module configured to detect an energy of the pulsed light beam and to produce a signal that indicates an energy of the pulsed light beam;
   a wavelength detection module configured to detect a wavelength of the pulsed light beam and to produce a signal that indicates the wavelength of the pulsed light beam; and
   a gas detection module configured to detect an amount of a gas mixture injected into the one or more chambers and the produce a signal that indicates the amount of the gas mixture injected, and wherein
   each of the bandwidth detection module, the energy detection module, and the wavelength detection module produce a beam quality metric based on, respectively, the signal produced by the bandwidth detection module, the signal produced by the energy detection module, and the signal produced by the wavelength detection module,
   the monitoring module analyzes the beam quality metric by analyzing the beam quality metric from the bandwidth detection module, the energy detection module, and the wavelength detection module, and
   the monitoring module is configured to determine the health status based on the analyzed beam quality metric, the signal produced by the gas detection module, and the signal produced by the discharge detection module.

4. The system of clause 3, wherein the plurality of detection modules further comprises a sensor configured to detect fluorine and to produce a signal that indicates a concentration of fluorine in the gaseous gain medium, and the monitoring module is configured to determine the health status based on the signal produced by the sensor.

5. The system of clause 3, wherein the optical source comprises two chambers, one of the two chambers comprising a master oscillator and the other of the two chambers comprising a power amplifier, and the system further comprises a timing controller configured to control discharge events in the master oscillator and the power amplifier, and the plurality of detection modules further comprises a timing detection module configured to monitor a difference in time between a discharge event in the master oscillator and a discharge event in the power amplifier.

6. The system of clause 5, wherein the optical source is associated with a plurality of parameters, each of the parameters having an acceptable range of values, and to analyze the produced signals from the plurality of detection modules, the monitoring module is configured to determine whether the beam quality metric in each signal is within the acceptable range of values associated with that parameter.

7. The system of clause 1, further comprising an optical lithography system configured to receive the pulsed light beam from the optical source, and wherein at least some of the detection modules are configured to receive data related to the pulsed light beam from the optical lithography system.

8. The system of clause 1, wherein the beam quality metric has only two possible values.

9. The system of clause 1, wherein
   the beam quality metric has a plurality of possible values, the plurality of possible values comprising a first value that indicates that the pulsed light beam does not meet the pre-defined specification,
   the monitoring module being configured to analyze the beam quality metric comprises the monitoring module being configured to count occurrences of the first value over a period of time or for a finite number of pulses, the monitoring module being configured to determine the health status of the gaseous gain medium comprises the monitoring module being configured to compare the count of occurrences to a threshold, and the produced status signal indicates to end use of the gaseous gain medium if the count of occurrences exceeds the threshold.

10. A system comprising:

a lithography system, the lithography system comprising an optical source, the optical source comprising at least one chamber configured to hold a gaseous gain medium, the gaseous gain medium being associated with an assumed gas life; and a monitoring system comprising:

a monitoring data interface configured to receive information from the lithography system; and an electronic storage configured to store one or more rules and a library of modules, wherein each of the one or more rules associates an aspect of the gaseous gain medium with at least one module in the library of modules, and the monitoring system is configured to:

access at least one rule, identify a module from a library of modules based on the accessed rule, and determine a health status for the gaseous gain medium in the optical source using the identified module and information from the lithography system, 11. The system of clause 10, wherein the monitoring system is further configured to produce a status signal based on the determined health status, the status signal indicating whether to extend use of the gaseous gain medium beyond the assumed gas life or to end use of the gaseous gain medium.

12. The system of clause 11, further comprising a gas refill system fluidly coupled to at least one chamber, and wherein, when the status signal indicates to end use of the gaseous gain medium, the monitoring system is further configured to provide a command signal to the gas refill system, the command signal being sufficient to cause the gas refill system to remove the gaseous gain medium from the chamber and add a new gas mixture into the chamber.

13. The system of clause 11, wherein the assumed gas life for the gaseous gain medium is a maximum number of occurrences of a discharge event in the chamber that holds the gaseous gain medium, and the system further comprises a discharge count detection module configured to detect an occurrence of a discharge event in the chamber that holds the gaseous gain medium and to produce a discharge event count signal, the discharge event count signal indicating a count of discharge events over a period of time.

14. The system of clause 13, wherein, when the status signal indicates to end use of the gaseous gain medium, the monitoring system is further configured to provide a command signal to a gas refill system, the command signal being sufficient to cause the gas refill system to remove the gaseous gain medium from the chamber and to add a new gas into the chamber.

15. The system of clause 14, wherein the monitoring system is further configured to compare the count of discharge events over the period of time to an initial analysis threshold, the initial analysis threshold being less than the assumed gas life, and the monitoring system is configured to determine the health status for the gaseous gain medium and produce the status signal only if the count of discharge events over the period time is greater than the initial analysis threshold.

16. The system of clause 10, wherein the identified module is configured to compare the information from the optical system to a data threshold to determine a health status of the gaseous gain medium, and the data threshold is configured to adapt during operation of the lithography system.

17. The system of clause 10, wherein the lithography system further comprises a lithography tool, and the monitoring system being configured to receive information from the lithography system comprises the monitoring system being configured to receive information from the lithography tool and/or the optical source.

18. The system of clause 10, wherein the information from the lithography system comprises data from a plurality of detectors, each detector configured to monitor a particular aspect of a light beam produced by the optical source and to produce a signal comprising data related to the aspect of the light beam, the electronic storage stores a plurality of rules, the rules comprising at least one rule associated with each of the plurality of detectors, the library of modules comprises a plurality of decision modules, each decision module being configured to:

analyze the data related to a particular aspect of the light beam from one of the plurality of detectors by comparing the data to a respective criterion, determine whether the particular aspect the light beam is in or out of specification, and output a status indicator for the particular aspect, and the monitoring system is configured to determine the health status of the gaseous gain medium by analyzing all of the status indicators output by the decision module.

19. The system of clause 10, wherein the assumed gas life for the gaseous gain medium is a maximum number of occurrences of a discharge event in the chamber that holds the gaseous gain medium, and the system further comprises a discharge count detection module configured to detect an occurrence of a discharge event in the chamber that holds the gaseous gain medium and to produce a discharge event count signal, the discharge event count signal indicating a count of discharge events over a period of time, the at least one rule comprises at least a gas baseline rule that associates the count of discharge events with at least a first module and a second module in the library of modules, the first module is configured to: measure and store a parameter related to operation of the optical source as a baseline measurement, and to determine the health status as a baseline status, the second module is configured to: compare a measured parameter to the stored baseline measurement, and to determine the health status based at least on the measured parameter, the gas baseline rule compares the count of discharge events to a threshold and identifies:

the first module if the count is less than the threshold, or the second module if the metric is greater than or equal to the threshold.

20. A monitoring system comprising:

a monitoring data interface configured to communicate with a plurality of lithography systems, each of the plurality of lithography systems comprising an optical source configured to hold a gaseous gain medium associated with an assumed gas life; and an electronic storage configured to store one or more rules and a library of modules, wherein each of the one or more rules associates an aspect of the gaseous gain medium with at least one module in the library of modules, and the monitoring system is configured to:
access at least one rule,
identify a module from a library of modules based on the accessed rule,
determine a health status for the gaseous gain medium in a first group of lithography systems using the identified module and information from the first group of lithography systems, wherein the first group of lithography systems comprises at least one of the plurality of lithography systems, and
determine whether to extend the use of the gaseous gain medium in a second group of lithography systems beyond the assumed gas life based on the determined health status, wherein the second group of lithography systems comprises one or more of the plurality of lithography systems that are not in the first group of lithography systems.

21. The monitoring system of clause 20, wherein the identified module is configured to compare the information from the first group of lithography systems to a data threshold to determine a health status of the gaseous gain medium, and the data threshold is configured to adapt during operation of the lithography system.

22. The monitoring system of clause 21, wherein the same data threshold is applied to information from all of the lithography systems, and the data threshold for all of the lithography systems is adapted during operation of the lithography system based on data from the first group of lithography systems.

23. The monitoring system of clause 20, wherein the information from the first group of lithography systems comprises information from the optical source of each lithography system in the first group of lithography systems.

24. The monitoring system of clause 20, wherein each of the lithography systems further comprises an optical lithography apparatus, and the information from the first group of lithography systems comprises information from the optical source of each lithography system in the first group of lithography systems and from each optical lithography apparatus in the first group of lithography systems.

Other implementations are within the scope of the claims.

What is claimed is:

1. A system comprising:
an optical source configured to emit a pulsed light beam, the optical source comprising one or more chambers, each of the one or more chambers configured to hold a gaseous gain medium, the gaseous gain medium being associated with an assumed gas life;
at least one detection module configured to:
receive and analyze data related to the pulsed light beam, and
produce a beam quality metric based on the data related to the pulsed light beam; and
a monitoring module configured to:
determine whether a health status of the gaseous gain medium is good based on a comparison between the beam quality metric and a threshold specific to the data that produced the beam quality metric, and
if it is determined that the health status is good, issue a command signal indicating to extend use of the gaseous gain medium beyond the assumed gas life.

2. The system of claim 1, wherein the threshold specific to the data that produced the beam quality metric includes a pre-determined specification, and the beam quality metric comprises an optical energy of the pulsed light beam, a spectral bandwidth of the pulsed light beam, and/or a wavelength of the pulsed light beam.

3. The system of claim 1, further comprising an optical lithography system configured to receive the pulsed light beam from the optical source, and wherein at least some of the detection modules are configured to receive data related to the pulsed light beam from the optical lithography system.

4. The system of claim 1, wherein the beam quality metric has only two possible values.

5. The system of claim 1, wherein
the beam quality metric has a plurality of possible values, the plurality of possible values comprising a first value that indicates that the pulsed light beam does not meet the pre-defined specification,
the monitoring module being configured to analyze the beam quality metric comprises the monitoring module being configured to count occurrences of the first value over a period of time or for a finite number of pulses,
the monitoring module being configured to determine the health status of the gaseous gain medium comprises the monitoring module being configured to compare the count of occurrences to a threshold, and
the produced status signal indicates to end use of the gaseous gain medium if the count of occurrences exceeds the threshold.

6. A system comprising:
an optical source configured to emit a pulsed light beam, the optical source comprising one or more chambers, each of the one or more chambers configured to hold a gaseous gain medium, the gaseous gain medium being associated with an assumed gas life;
at least one detection module configured to:
receive and analyze data related to the pulsed light beam, and
produce a beam quality metric based on the data related to the pulsed light beam, the beam quality metric comprises an optical energy of the pulsed light beam, a spectral bandwidth of the pulsed light beam, and/or a wavelength of the pulsed light beam; and
a monitoring module configured to:
analyze the beam quality metric including determining whether the pulsed light beam meets a pre-determined specification,
determine a health status of the gaseous gain medium based on the analysis of the beam quality metric, and
produce a status signal based on the determined health status, the status signal indicating whether to extend use of the gaseous gain medium beyond the assumed gas life or to end use of the gaseous gain medium,
wherein the at least one detection module comprises a plurality of detection modules, the plurality of detection modules comprising:
a discharge count detection module configured to detect an occurrence of a discharge event in any of the one or more chambers and to produce a signal that indicates a count of discharge events over a period of time;
a bandwidth detection module configured to detect a spectral bandwidth of the pulsed light beam and to produce a signal that indicates a spectral bandwidth of the pulsed light beam;
an energy detection module configured to detect an energy of the pulsed light beam and to produce a signal that indicates an energy of the pulsed light beam;

a wavelength detection module configured to detect a wavelength of the pulsed light beam and to produce a signal that indicates the wavelength of the pulsed light beam; and a gas detection module configured to detect an amount of a gas mixture injected into the one or more chambers and the produce a signal that indicates the amount of the gas mixture injected, and wherein each of the bandwidth detection module, the energy detection module, and the wavelength detection module produce a beam quality metric based on, respectively, the signal produced by the bandwidth detection module, the signal produced by the energy detection module, and the signal produced by the wavelength detection module, the monitoring module analyzes the beam quality metric by analyzing the beam quality metric from the bandwidth detection module, the energy detection module, and the wavelength detection module, and the monitoring module is configured to determine the health status based on the analyzed beam quality metric, the signal produced by the gas detection module, and the signal produced by the discharge detection module.

7. The system of claim 6, wherein the plurality of detection modules further comprises a sensor configured to detect fluorine and to produce a signal that indicates a concentration of fluorine in the gaseous gain medium, and the monitoring module is configured to determine the health status based on the signal produced by the sensor.

8. The system of claim 6, wherein the optical source comprises two chambers, one of the two chambers comprising a master oscillator and the other of the two chambers comprising a power amplifier, and the system further comprises a timing controller configured to control discharge events in the master oscillator and the power amplifier, and the plurality of detection modules further comprises a timing detection module configured to monitor a difference in time between a discharge event in the master oscillator and a discharge event in the power amplifier.

9. The system of claim 8, wherein the optical source is associated with a plurality of parameters, each of the parameters having an acceptable range of values, and to analyze the produced signals from the plurality of detection modules, the monitoring module is configured to determine whether the beam quality metric in each signal is within the acceptable range of values associated with that parameter.

10. A system comprising:
a lithography system, the lithography system comprising an optical source, the optical source comprising at least one chamber configured to hold a gaseous gain medium, the gaseous gain medium being associated with an assumed gas life; and a monitoring system comprising:
a monitoring data interface configured to receive information from the lithography system; and an electronic storage configured to store one or more rules and a library of modules, wherein each of the one or more rules associates an aspect of the gaseous gain medium with at least one module in the library of modules, and the monitoring system is configured to:
access at least one rule,
identify a module from a library of modules based on the accessed rule, and determine a health status for the gaseous gain medium in the optical source using the identified module and information from the lithography system.

11. The system of claim 10, wherein the monitoring system is further configured to produce a status signal based on the determined health status, the status signal indicating whether to extend use of the gaseous gain medium beyond the assumed gas life or to end use of the gaseous gain medium.

12. The system of claim 11, further comprising a gas refill system fluidly coupled to at least one chamber, and wherein, when the status signal indicates to end use of the gaseous gain medium, the monitoring system is further configured to provide a command signal to the gas refill system, the command signal being sufficient to cause the gas refill system to remove the gaseous gain medium from the chamber and add a new gas mixture into the chamber.

13. The system of claim 11, wherein the assumed gas life for the gaseous gain medium is a maximum number of occurrences of a discharge event in the chamber that holds the gaseous gain medium, and the system further comprises a discharge count detection module configured to detect an occurrence of a discharge event in the chamber that holds the gaseous gain medium and to produce a discharge event count signal, the discharge event count signal indicating a count of discharge events over a period of time.

14. The system of claim 13, wherein, when the status signal indicates to end use of the gaseous gain medium, the monitoring system is further configured to provide a command signal to a gas refill system, the command signal being sufficient to cause the gas refill system to remove the gaseous gain medium from the chamber and to add a new gas into the chamber.

15. The system of claim 14, wherein the monitoring system is further configured to compare the count of discharge events over the period of time to an initial analysis threshold, the initial analysis threshold being less than the assumed gas life, and the monitoring system is configured to determine the health status for the gaseous gain medium and produce the status signal only if the count of discharge events over the period of time is greater than the initial analysis threshold.

16. The system of claim 10, wherein the identified module is configured to compare the information from the optical system to a data threshold to determine a health status of the gaseous gain medium, and the data threshold is configured to adapt during operation of the lithography system.

17. The system of claim 10, wherein the lithography system further comprises a lithography tool, and the monitoring system being configured to receive information from the lithography system comprises the monitoring system being configured to receive information from the lithography tool and/or the optical source.

18. The system of claim 10, wherein
the information from the lithography system comprises data from a plurality of detectors, each detector configured to monitor a particular aspect of a light beam produced by the optical source and to produce a signal comprising data related to the aspect of the light beam,
the electronic storage stores a plurality of rules, the rules comprising at least one rule associated with each of the plurality of detectors,
the library of modules comprises a plurality of decision modules, each decision module being configured to:

analyze the data related to a particular aspect of the light beam from one of the plurality of detectors by comparing the data to a respective criterion, determine whether the particular aspect the light beam is in or out of specification, and output a status indicator for the particular aspect, and the monitoring system is configured to determine the health status of the gaseous gain medium by analyzing all of the status indicators output by the decision module.

19. The system of claim 10, wherein the assumed gas life for the gaseous gain medium is a maximum number of occurrences of a discharge event in the chamber that holds the gaseous gain medium, and the system further comprises a discharge count detection module configured to detect an occurrence of a discharge event in the chamber that holds the gaseous gain medium and to produce a discharge event count signal, the discharge event count signal indicating a count of discharge events over a period of time, the at least one rule comprises at least a gas baseline rule that associates the count of discharge events with at least a first module and a second module in the library of modules, the first module is configured to: measure and store a parameter related to operation of the optical source as a baseline measurement, and to determine the health status as a baseline status, the second module is configured to: compare a measured parameter to the stored baseline measurement, and to determine the health status based at least on the measured parameter, the gas baseline rule compares the count of discharge events to a threshold and identifies: the first module if the count is less than the threshold, or the second module if the metric is greater than or equal to the threshold.

20. A monitoring system comprising:

a monitoring data interface configured to communicate with a plurality of lithography systems, each of the plurality of lithography systems comprising an optical source configured to hold a gaseous gain medium associated with an assumed gas life; and an electronic storage configured to store one or more rules and a library of modules, wherein each of the one or more rules associates an aspect of the gaseous gain medium with at least one module in the library of modules, and the monitoring system is configured to:

access at least one rule, identify a module from a library of modules based on the accessed rule, determine a health status for the gaseous gain medium in a first group of lithography systems using the identified module and information from the first group of lithography systems, wherein the first group of lithography systems comprises at least one of the plurality of lithography systems, and determine whether to extend the use of the gaseous gain medium in a second group of lithography systems beyond the assumed gas life based on the determined health status, wherein the second group of lithography systems comprises one or more of the plurality of lithography systems that are not in the first group of lithography systems.

21. The monitoring system of claim 20, wherein the identified module is configured to compare the information from the first group of lithography systems to a data threshold to determine a health status of the gaseous gain medium, and the data threshold is configured to adapt during operation of the lithography system.

22. The monitoring system of claim 21, wherein the same data threshold is applied to information from all of the lithography systems, and the data threshold for all of the lithography systems is adapted during operation of the lithography system based on data from the first group of lithography systems.

23. The monitoring system of claim 20, wherein the information from the first group of lithography systems comprises information from the optical source of each lithography system in the first group of lithography systems.

24. The monitoring system of claim 20, wherein each of the lithography systems further comprises an optical lithography apparatus, and the information from the first group of lithography systems comprises information from the optical source of each lithography system in the first group of lithography systems and from each optical lithography apparatus in the first group of lithography systems.

* * * * *